United States Patent
Oshika et al.

(10) Patent No.: US 8,581,106 B2
(45) Date of Patent: Nov. 12, 2013

(54) SUBMOUNT

(75) Inventors: Yoshikazu Oshika, Tokyo (JP);
Masayuki Nakano, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 185 days.

(21) Appl. No.: 13/206,389

(22) Filed: Aug. 9, 2011

(65) Prior Publication Data

US 2012/0012373 A1    Jan. 19, 2012

Related U.S. Application Data

(62) Division of application No. 11/908,861, filed as application No. PCT/JP2006/305461 on Mar. 17, 2006, now Pat. No. 8,472,208.

(30) Foreign Application Priority Data

| Mar. 18, 2005 | (JP) | 2005-079985 |
| Mar. 28, 2005 | (JP) | 2005-091941 |
| Mar. 31, 2005 | (JP) | 2005-105044 |
| Mar. 31, 2005 | (JP) | 2005-105045 |
| Mar. 31, 2005 | (JP) | 2005-105046 |

(51) Int. Cl.
*H05K 1/09* (2006.01)

(52) U.S. Cl.
USPC ........... 174/257; 174/256; 174/258; 174/260; 361/772; 361/777

(58) Field of Classification Search
USPC ............... 174/250–260; 361/772–777
See application file for complete search history.

(56) References Cited

U.S. PATENT DOCUMENTS

| 5,248,376 A * | 9/1993 | Saito .............. 117/106 |
| 5,622,305 A | 4/1997 | Bacon et al. |
| 6,693,936 B2 | 2/2004 | Kitaoka et al. |
| 2001/0002918 A1* | 6/2001 | Tatoh ............. 374/179 |

(Continued)

FOREIGN PATENT DOCUMENTS

| JP | 59-159583 A | 9/1984 |
| JP | 01-138777 A | 5/1989 |

(Continued)

OTHER PUBLICATIONS

U.S. Appl. No. 11/908,861, filed Dec. 11, 2008.

(Continued)

*Primary Examiner* — Tuan T Dinh
(74) *Attorney, Agent, or Firm* — Chen Yoshimura LLP

(57) ABSTRACT

A submount with an electrode layer having excellent wettability in soldering and method of manufacturing the same are disclosed. A submount (1) for having a semiconductor device mounted thereon comprises a submount substrate (2), a substrate protective layer (3) formed on a surface of the submount substrate (2), an electrode layer (4) formed on the substrate protective layer (3) and a solder layer (5) formed on the electrode layer (3) wherein the electrode layer (4) is made having an average surface roughness of less than 1 µm. The reduced average surface roughness of the electrode layer (4) improves wettability of the solder layer (5), allowing the solder layer (5) and a semiconductor device to be firmly bonded together without any flux therebetween. A submount (1) is thus obtained which with the semiconductor device mounted thereon is reduced in heat resistance, reducing its temperature rise and improving its performance and service life.

1 Claim, 32 Drawing Sheets

(56) References Cited

U.S. PATENT DOCUMENTS

| | | |
|---|---|---|
| 2003/0197277 A1 | 10/2003 | Yamamoto et al. |
| 2004/0214029 A1 | 10/2004 | Carey et al. |
| 2005/0067636 A1 | 3/2005 | Amoh et al. |
| 2005/0079717 A1 | 4/2005 | Savas et al. |
| 2005/0127147 A1 | 6/2005 | Kao et al. |
| 2006/0037690 A1 | 2/2006 | Ishiyama et al. |
| 2009/0207580 A1 | 8/2009 | Oshika et al. |

FOREIGN PATENT DOCUMENTS

| | | |
|---|---|---|
| JP | 06-3815 B2 | 1/1994 |
| JP | 6-61277 A | 3/1994 |
| JP | 08-31654 B2 | 3/1996 |
| JP | 11-186295 A | 7/1999 |
| JP | 2001-57468 A | 2/2001 |
| JP | 2001-308438 A | 11/2001 |
| JP | 2002-368020 A | 12/2002 |
| JP | 2003-258360 A | 9/2003 |
| JP | 2003-309223 A | 10/2003 |
| WO | 03/075341 A1 | 9/2003 |
| WO | 2006/098454 A1 | 9/2006 |

OTHER PUBLICATIONS

Kuhmann et al., "Oxidation and Reduction Kinetics of Eutectic SnPb, InSn and AuSn: A Knowledge Base for Fluxless Solder Bonding Applications", IEEE Electronic Components and Technology Conference, pp. 120-126, 1997.

Dohle et al., "Low Temperature Bonding of Epitaxial Lift Off Device with AuSn", IEEE Transactions on Components, Packaging and Manufacturing Technology—Part B, vol. 19, No. 3, pp. 575-580, Aug. 1996.

Lee et al., "Fluxless Non-Eutectic Joints Fabricated Using Gold—Tin Multilayer Composite", IEEE Transactions on Components and Packaging Technologies, vol. 26, No. 2, pp. 416-422, Jun. 2003.

Chang et al., "Effect of Joint Strength of PbSn and AuSn Solders on Temperature Cycling Tests in Laser Packages", IEEE Conference Proceedings, LEOS Annual Meeting, IEEE Lasers and Electro—Optics Society, pp. 800-801, 1999.

Nakahara et al., "Room Temperature Interdiffusion Studies of Au/Sn Thin Film Couples", Thin Solid Films, vol. 84, pp. 185-196, 1981.

Hutter et al., "Calculation of Shape and Experimental Creation of AuSn Solder Bumps for Flip Chip Applications", IEEE Proceedings Electronic Components & Technology Conference, pp. 282-288, 2002.

International Search Report (ISR) for PCT/JP2006/305461 (International application) mailed in Jun. 2006 for Examiner consideration.

Written Opinion (PCT/ISA/237) issued in PCT/JP2006/305461 (International application) mailed in Jun. 2006.

\* cited by examiner (A)

(B)

(A)

(B)

(A)

(B)

(A)

(B)

(A)

(B)

(A)

(B)

SUBMOUNT

This application is a divisional of a pending application, U.S. Ser. No. 11/908,861 filed on Dec. 11, 2008, which is the National Stage Application of PCT International Application No. PCT/JP2006/305461, both of which are hereby incorporated by reference in their entirely.

TECHNICAL FIELD

The present invention relates to a submount for use with a semiconductor device and a method of manufacturing the same.

BACKGROUND ART

A semiconductor device when packaged is normally mounted on a cooling plate or heat sink to dissipate heat emitted from the semiconductor device. Between the semiconductor device and the heat sink, a substrate member, namely a submount having high conductivity may be interposed to improve the heat radiation property. Such a high heat conductivity substrate member is known to be made of aluminum nitride or the like.

When the submount and a semiconductor device are soldered together, one requirement to be met is their bonding strength. The prior art has provided an adherent layer of an expensive noble metal to this end, or has adjusted the surface roughness of a substrate member itself in order to enhance the bonding strength between the substrate and an electrode layer disposed beneath the bottom of a solder layer.

Patent Reference 1 discloses a submount in which a substrate is coated with metal layers of Ti, Pt and Au laid in turn and in particular a structure thereof that a semiconductor light emitting device is mounted on Au via a solder adherent layer made of Ti and Pt and a solder layer. In this Reference, the solder layer and the semiconductor light emitting device soldered together have their bonding strength of 40 MPa or more and the substrate used for the submount has a surface roughness (Ra) preferably of 1 µm or less, more preferably of 0.1 µm or less. When the surface roughness of 1 µm is exceeded, it is stated that a clearance tends to be formed between the device and the submount when soldered together, thereby lowering the cooling effect of the semiconductor light emitting device.

Patent Reference 2 discloses a submount having a substrate of AlN coated with Ti, Pt and Au metal layers formed in turn and in particular comparative examples therein showing that the AlN substrate when made having a surface roughness (Ra) of 0.1 to 0.5 µm offers a submount which can withstand thermal cycling with its effect to anchor the formed metals and has high strength of their bonding to the substrate. It is also disclosed that the AlN substrate when made to have an excessively low surface roughness is unable to yield enough strength of the bonding. As a substrate material high in thermal conductivity, mention may be of aluminum nitride or the like (see, for example, Patent Reference 3).

Patent References 3, 4 and 5 infra disclose a submount for optical semiconductor device which has a first surface on which a semiconductor laser (LD) chip is mounted and a second surface which is soldered with a metal block heat sink, both of which surfaces are each formed with a barrier layer and an alloy layer of Au and Sn or Sn and Pb. In these References, each of the alloy layers is formed by vapor deposition and has its alloy composition adjusted in a proportion such as, for example, Au:Sn=70:30 (in atomic percent) so that it is a eutectic alloy. The alloy layers are molten to joint the submount with the LD chip and radiating metal block, respectively.

Patent References 3 and 5 disclose a semiconductor laser diode of which a heat generating active layer is soldered with and bonded to a submount to permit improving its heat dissipation property. In this case, the obverse side of the active layer that is very thin as formed by epitaxial growth is bonded with its obverse side facing downwards, that is so-called junction-down to the submount. As a result, a short circuiting failure is liable to occur due to the fact that at the time of soldering, solder layer tends to stick to the pn junction.

Thus, the submount is an extremely important component not only to function as soldering when the submount is die-bonded but also to alleviate the distortion of a semiconductor device by the thermal expansion of a heat sink metal block during the die bonding. In order to join this submount with a semiconductor device chip mounted on the submount and with a submount substrate serving as a heat sink, a solder layer has been used which is formed on each side and/or both sides of the submount.

For reducing environmental loads, the use of a solder not containing Pb as the soldering material, namely a Pb free solder, has been well under way, and a solder composition such as of Au—Sn, Ag—Sn, In—Sn or Zn—Sn using its substitute material has been proposed. In the case of a Pb free solder, however, the melting point is higher than that of a Pb solder (183° C. of Pb—Sn) so that its reduced difference from the heatproof temperature may, when a semiconductor device is soldered, give rise to the problem of deterioration of the device. Further, increase in the amount of Sn or In used may make the surface liable to oxidize, adversely affecting wettability of the solder itself as well.

Here, mention is made of wettability between a solder layer and an electrode layer in soldering as one of the most important characteristics to be considered in soldering a semiconductor device with a submount via the solder layer. A Pb free solder normally used is poor in wettability, generally necessitating a rosin flux etc. On the other hand, in the case of solder soldering using a flux as in cream solder or ball solder screen printing, a surface is wetted by the flux so that there is little effect by solder wettability. However, when a solder mass very small in thickness and volume as in a submount is soldered with a semiconductor device likewise very small in thickness and volume, an effect of the flux on the output reliability of the semiconductor device to be soldered cannot be ignored so that the soldering may be effected without the flux. As a result, the solder wettability in the submount has been very poor.

In such a solder layer, especially where it is a solder layer composed of Sn and In constituents as solder materials having low melting points, Sn and In exposed to the surface are liable to oxidize, tending to form on the surface oxides under the influence of which it may become hard to join the solder mass. As a way to overcome this difficulty, it is reported in Nonpatent Reference 1 to place the solder layer containing Sn and In components in a vacuum or reducing atmosphere to remove the oxides prior to soldering.

Nonpatent Reference 2 reports on an Au—Sn system solder layer in which Sn and Au sub-layer are formed one upon another with the uppermost sub-layer constituted by an Au layer so that Sn is not exposed to the top surface. Nonpatent Reference 3 reports on making a multi-layered structure in which Sn is not exposed to the surface as a solder used in bonding Si semiconductor device onto Si substrate. Nonpatent Reference 4 reports on a technique in which while in a submount the solder layer itself is formed of an alloy, Au layer is formed on the solder layer to serve as an anti-oxidant.

When a Pb free solder is used, a layer of the solder has been made having a multi-layered structure such that metal liable to oxidize is not exposed to the surface and having a eutectic composition for soldering. Then, it is reported that because the solder layer itself is in a non-equilibrium state and if left at room temperature goes on to its equilibrium state, metal atoms diffuse easily (see Nonpatent References 5 and 6).

Thus in the prior art, use has been made of a solder layer which before melting is of the form in which it has the structure that a eutectic composition consisting of the solder elements is alloyed (hereinafter, referred to conveniently as alloyed solder layer). To wit, in the step of forming an unmolten solder layer on a submount substrate, a method has generally been employed which adjusts the composition ratio of metal elements constituting the solder layer so that the composition is eutectic. The composition of a solder composed of Sn element and anyone or a combination of metal elements such as Au, Ag and Pb has been adjusted, for example, that of an Au—Sn alloyed solder layer so as to be proportioned Au:Sn=70:30 (in atomic percent).

Further, one of the requirements to be met in soldering a submount and a semiconductor light emitting device together is to decrease variations of their bonding temperature. When a submount and a semiconductor light emitting device are soldered together, a solder layer formed on the submount is heated and molten until it becomes liquid phase and brought into contact with an electrode formed on the side of the semiconductor device and then cooled and solidified, thereby causing the submount and the semiconductor light emitting device to be soldered together via the molten solder layer. Heating the solder layer is done by widespread heating using a resistance heating furnace or heating stage or by localized rapid heating such as localized lamp or hot-gas heating as selected with particular forms of packaging or degrees of workability taken into account. However, if heating is done using localized rapid heating, variations in heating temperature may often occur due to differences in materials of the submount and semiconductor device or in performance of the heaters used. And, if the temperature of the heater is designed to reach is lower than a targeted bonding temperature, the failure such as unmolten bonding or insufficient wetting in solder would tend to occur. Conversely, if the temperature of the heater is higher than the targeted bonding temperature, then the failure due to breakdown of the semiconductor device chip was occurred sometime.

Also, in order to prevent short-circuit failure due to a solder layer scrambling up a semiconductor device, the solder layer with its thickness reduced to about 5,000 Å (0.5 μm) was formed by vapor deposition in Patent Reference 3. In Patent Reference 5, to prevent flow of a solder layer, the submount is formed with a solder flow preventing groove to allow the solder to flow into the groove.

By the way, there may be a submount formed with a circuit pattern on which to mount a semiconductor device. A micropattern such as of an electrode layer can be formed comparatively with ease if photolithography is used. The photolithography generally uses an alkaline liquid developer such as tetramethyl amine family. According to this method, it is possible to make patterning in unit of 1 μm.

As a specific method of forming an electrode using the photolithography, the lift-off method is prevailing. In the lift-off method, a resist is in advance is coated over a surface by a spinning coating apparatus and then patterning is first performed by the photolithography. Thereafter, an electrode is formed in layer by vapor deposition or sputtering and the resist is dissolved to remove portions on the surface of the resist, thereby forming the electrode as desired. In the development by photolithography after patterned exposure, however, a liquid developer when directly contacting with the surface of a submount substrate on which an electrode is to be vapor deposited may corrode and roughen the substrate surface depending on the type of its material.

REFERENCES CITED

Patent Reference 1: Japanese Patent Laid Open Application, JP P 2002-368020 A;

Patent Reference 2: Japanese Patent Laid Open Application, JP P 2001-308438 A;

Patent Reference 3: Japanese Patent Laid Open Application, JP P H01-138777 A;

Patent Reference 4: Japanese Patent, JP P H06-3815 B; and

Patent Reference 5: Japanese Patent, JP P H08-31654 B,

Nonpatent Reference 1: J. F. Kuhmann and eight others, "Oxidation and Reduction Kinetics of Electric SnPb, InSn and AuSn: A Knowledge Base for Fluxless Solder Bonding Applications", IEEE Electronic Components and Technology Conference, pp. 120-126, 1997;

Nonpatent Reference 2: C. R. Dohle and three others, "Low Temperature Bonding of Epitaxial Lift Off Device with AuSn", IEEE Transactions on Components, Packaging and Manufacturing Technology—Part B, Vol. 19, No. 3, pp. 575-580, 1996;

Nonpatent Reference 3: C. C. Lee and one other, "Fluxless Non-Eutectic Joints Fabricated Using Gold-Tin Multilayer Composite", IEEE Transactions on Components, Packaging and Manufacturing Technologies, Vol. 26, No. 2, pp. 416-426, 2003;

Nonpatent Reference 4: H. L. Chang and eleven others, "Effect of Joint Strength of PbSn and AuSn Solders on Temperature Cycling Tests in Laser Packages", IEEE Conference Proceedings, LEOS Annual Meeting, IEEE Lasers and Electro-Optics Society, pp. 800-801, 1999;

Nonpatent Reference 5: S. Nakahara and three others, "ROOM TEMPERATURE INTERDIFFUSION STUDIES OF Au/Sn THIN FILM COUPLES", Thin Solder Films, Vol. 84, pp. 185-196, 1981: and Nonpatent Reference 6: M. Hutter and six others, "Calculation of Shape and Experimental Creation of AuSn Solder Bumps for Flip Chip Applications", IEEE Proceedings Electronic Components & Technology Conference, pp. 282-288, 2002.

DISCLOSURE OF THE INVENTION

Problems to be Solved by the Invention

As mentioned above, the conventional submounts have necessitated drop of bonding strength due to the deterioration of extendibility in solder wetting or they were excessively raising the solder melting temperature for soldering. As a result, there has been the problem that a semiconductor device to be soldered can deteriorate in quality or can be broken down. The circumstances have stood that the energy efficiency in the solder soldering process becomes worse, too. Also, there arises the problem that the material cost is raised high when the noble metal is used for the adherent layer.

When an electrode is formed on a submount by the lift-off method, the substrate surface tends to be larger in surface roughness. While this has the effect of increasing the strength of bonding of the electrode layer to the substrate surface on which it is formed, the problem also arises that the electrode layer formed on the substrate surface larger in surface roughness becomes larger in surface roughness at the same time.

In view of the problems mentioned above, it is accordingly a first object of the present invention to provide a submount having an electrode layer that excels in wettability in solder soldering and a method of manufacturing such a submount.

When a semiconductor device is soldered using a Pb free solder as in the prior art, intense requirements arise that:

(1) the solder should be melted at a temperature as low as possible; and (2) the solder should be made well meltable, thereby soldering at a lowest possible temperature and quickly, namely that the semiconductor device be soldered at a minimum amount of heat. This temperature reduction is an aim to be achieved to improve the productivity by shortening the time period for a soldering process.

While the melting point of a solder is determined per se by its material composition, its meltability is controlled by constitutional structure and surface states of the solder layer prior to melting. Especially, the oxidizing state of the solder where it is used in a small amount such as in mounting of a semiconductor chip influences the bonding property to a major degree and may make it no longer possible to bond firmly.

In a Pb free solder, even where the solder is made in a multi-layered structure in which a metal such as Sn liable to oxidize is not exposed to the surface, atoms of the metal easily diffuse even at room temperature so that voids are created in the solder, impairing reliability of the bonding itself. In what is called flush-heating bonding method, a method in which a halogen lamp is used to fuse a solder instantaneously for bonding, Au provided on the surface of a solder layer for its anti-oxidation must be fully heated to melt and to be absorbed into the solder layer, there being the problem of bonding failure itself and an increase in load on a semiconductor device due to excessive heating to more than the melting point and prolonged heating time needed. In the prior art, to improve the solder in its meltability a technique may be used in which the solder has an oxide reductively removed in a vacuum and reductive atmosphere but the technique necessitates a large-scale apparatus while increasing the cost of manufacture.

With respect to the solder meltability of a Pb free solder as mentioned above, there is the problem that the technique of inhibiting oxidation of a solder surface for raising the meltability impedes per se raising the meltability as its original aim.

In view of the problems mentioned above, it is a second object of the present invention to provide a submount provided with a plurality of solder layers different in melting point and a solder protective layer which inhibits the solder layers from oxidizing.

Further, when a Pb free solder of relatively high melting point such as Au—Sn eutectic solder is used, a semiconductor device chip often soldered at a heating temperature as low as possible to prevent the failure of a semiconductor device chip. As a result, a failure of the semiconductor device chip by the breakdown tends to occur and its remedies are being desired. One of factors affecting the boding failure due to variations in heating temperature, namely the boding variations, is a range of melting temperatures of a solder.

In view of the problems mentioned above, it is a third object of the present invention to provide a submount having a solder layer which is wide in range of melting temperatures to get rid of submount bonding variations and a method of manufacturing such a submount.

In a conventional submount, if a reduction in bonding strength between a submount substrate and a solder layer or between an electrode layer and the solder layer is coped with by providing an adherent layer between them, excessive process steps for forming the adherent layer and for its patterning are necessitated. As a result, the cost of manufacture is excessively required. Also, there arises the problem that for noble metal often used for the adherent layer, the material cost needed becomes excessive. The problem also comes up that a liquid developer directly contacting a submount substrate surface in the step of pattern forming for the electrode layer causes the substrate surface to be corroded and roughened depending on the substrate material, which exerts adverse influences on the subsequent forming of the solder layer.

In view of the problems mentioned above, it is a fourth object of the present invention to provide a submount in which adherence between one and other of the layers making up the submount, in particular between a submount substrate and an electrode layer and between the electrode layer and a solder layer is excellent and a method of manufacturing such a submount.

Further, in order to prevent short-circuit failure of a semiconductor device due to scrambling of a solder layer, the problem occurs that grooving a submount substrate is required, increasing the number of process steps.

In view of this problem, it is a fifth object of the present invention to provide a submount and a method of manufacturing the same provided with a solder layer which is wide in range of melting temperatures and when bonded to a device for mounting on the submount is kept low in its scrambling over the device.

Means for Solving the Problems

In order to achieve the first object mentioned above, the present inventors after zealous investigations added have come to know that in a submount when having a semiconductor device bonded thereto without using a flux and via a solder, the surface roughness of an electrode layer exerts an influence on wettability of the solder and have arrived at the present invention.

In order to achieve the first object, the present invention provides in a first aspect thereof a submount for having a semiconductor device mounted thereon, the submount comprising: a submount substrate, a substrate protective layer formed on a surface of the submount substrate, an electrode layer formed on the substrate protective layer and a solder layer formed on the electrode layer, characterized in that the electrode layer has an average surface roughness of less than 1 μm, preferably of less than 0.05 μm.

The submount substrate has an average surface roughness of less than 0.1 μm, desirably of less than 0.05 μm as has the electrode layer. Where no such electrode layer is disposed, the submount substrate likewise has an average surface roughness of less than 0.1 μm, preferably of less than 0.05 μm.

The absolute value of a differential in average surface roughness between the submount substrate where no such electrode layer is disposed and the electrode layer is preferably not more than 0.02 μm. The submount substrate is composed of a nitride ceramic, preferably of aluminum nitride. At least one of the substrate protective and electrode layers preferably contains at least two or more different metallic elements which are desirably ones of elements selected from the group which consists of gold, platinum, silver, copper, iron, aluminum, titanium, tungsten, nickel and molybdenum.

Thus, making the surface roughness of the electrode layer in the submount less than 0.1 μm allows raising the wettability of the solder layer and bonding the solder layer and the semiconductor device together firmly without any flux between them. To wit, it is possible to join a semiconductor device and a solder layer together while making the solder layer beneath the semiconductor device voidless, uniform and with a minimum possible thickness. This allows obtaining a submount which when having a semiconductor device mounted thereon is small in thermal resistance. Accordingly, when used with a submount according to the present invention, a semiconductor device is small in temperature rise, having its performance improved and its service life increased.

In order to achieve the first object mentioned above, the present invention further provides a method of manufacturing a submount comprising a submount substrate, a substrate protective layer formed on a surface of the submount substrate, an electrode layer formed on the substrate protective layer, and a solder layer formed on the electrode layer, characterized in that the method comprises the steps of: forming the substrate protective layer by coating a whole surface of the submount substrate with at least one of metals differing from those to be used for the electrode and solder layers; and forming the substrate protective layer with the electrode layer and solder layers of a selected pattern and thereafter removing portions of the substrate protective layer which are not covered with the electrode and solder layers.

The at least one of metals of which the substrate protective layer is formed and with which the whole surface of the submount substrate is coated is different from that of the electrode layer and selected from the group which consists of titanium, platinum, nickel, tungsten and molybdenum.

The manufacturing method mentioned above allows submounts with solder layers excellent in wettability to be manufactured at high yield.

In order to achieve the second object mentioned above, zealous investigations were followed with respect to the meltability of a solder layer and with its melting point and surface anti-oxidizing measures taken into account. As a result, the present inventors have come to know that raising the meltability of a solder layer itself by melting the solder divided in two or more stages by the time the temperature is elevated to the soldering temperature can be reconciled with easily melting a solder protective layer provided to prevent oxidation of the uppermost surface of the solder layer and have arrived at the present invention.

In order to achieve the second object, the present invention provides in a second aspect thereof a submount comprising a submount substrate for having a semiconductor device mounted thereon, a solder layer disposed on a surface of the submount substrate, and a solder protective layer disposed on an uppermost surface of the solder layer, characterized in that the solder layer comprises at least two layers of solder which are different in melting point.

The solder as their constituents contains at least two different elements selected from the group which consists of Ag, Au, Cu, Zn, Ni, In, Ga, Bi, Al and Sn and preferably comprises either of combinations Au and Sn and Ag and Sn or comprises Ag, Au and Sn.

So made, a submount according to the present invention allows the solder when heated to melt to be molten stepwise, moderating changes in melting point due to changing unmolten portions and compositional changes of the solder protective layer, thereby improving the solder's meltability.

Preferably, the layers of solder comprise two layers one of which is a layer of solder containing not less than 50% of Au element and the other of which is a layer of solder containing less than 50% of Au element. Alternatively, the layer of solder comprises two layers one of which is a layer of solder containing not less than 50% of Au and Ag elements and the other of which is a layer of solder containing less than 50% of Au and Ag elements. By lessening the amount of Au in one of two layers of solder while permitting the solder's melting point to be reduced thereby, it is possible to achieve a reduction in cost of manufacture.

The solder protective layer may be formed of a noble metal, especially of Au. This allows the solder formed on the submount to be molten stepwise and permits minimizing oxidation of the surface of a solder layer with the noble metal formed in the uppermost layer on the solder layer, thereby improving the solder's meltability.

In order to achieve the third object mentioned above, the present inventors have conducted zealous investigations with the range of melting temperatures of a solder layer taken into account. A layer of alloy solder of eutectic composition in the conventional submount exists as a perfect solid at a temperature less than what is called the eutectic point in the phase equilibrium diagram and when raised in temperature to the eutectic point is brought first into a liquid phase in which interdiffusion with an electrode of a semiconductor device is brought about and can then be bonded to the electrode. Thus, the range between from the temperature at which the solder layer begins to melt to the temperature at which it is brought fully into the liquid phase, namely the melting temperature range is conventionally 0° C. Thus, based on the knowledge acquired that as a result, if the solder layer is attempted to bond in a minimum amount of heating to its melting temperature or point, however small the fall from the latter may be, the solder layer should be in solid phase and can no longer be bonded to the semiconductor device, the present inventors have been led to conceive and arrive at the present invention.

In order to achieve the third object mentioned above, the present invention provides in a third aspect thereof a submount for having a semiconductor device mounted thereon, characterized in that it comprises a submount substrate and a solder layer formed on the submount substrate for having the semiconductor device soldered therewith and that the solder layer has a composition other than a eutectic composition of its constituent elements.

The said solder may have a difference in temperature existing between its melting start temperature and its full melting temperature. The difference in temperature preferably is 10° C. or more. Preferably, the solder layer when heated exhibits a differential thermal behavior having a difference in temperature of more than 10° C. between a temperature at which it first exhibits a differential thermal fluctuation and a temperature at which it exhibits a termination of the differential thermal fluctuation, showing that it is fully molten. Also, there preferably are two or more differential thermal peaks between the temperature at which the differential thermal fluctuation is first exhibited and the temperature at which termination of the differential thermal fluctuation is exhibited, showing that the solder layer is fully molten. The solder layer may be made of an alloy of Sn with at least one of metals selected from the group which consists of Au, Ag, Cu, Zn, In, Bi, Fe, Pb, Ti, Al, Sb and Ni. The submount substrate is preferably made of anyone of aluminum nitride, silicon carbide and silicon.

By making the solder layer deviated in composition from the eutectic composition, it is possible to widen the range in melting temperature of the solder to extend from its melting start temperature exhibited by the solidus temperature where the composition is not eutectic to its melting terminating temperature exhibited by the liquidus temperature. Then, the solder layer which at a temperature above the melting start temperature will take its liquid phase containing state will, in soldering with a semiconductor device, have interdiffusion brought about with an electrode of the semiconductor device, forming a junction sufficient to achieve a key function of the submount.

In order to attain the third object mentioned above, the present invention also provides a method of manufacturing a submount having a surface on one or each of its both sides on which a solder layer having a composition determined by constituent elements other than a eutectic composition is deposited, characterized in that the solder layer is formed by vapor deposition for each of the constituent elements.

Forming a solder layer not of the eutectic composition, e.g., by simultaneous binary vapor deposition allows accurately making a submount having the solder layer uniform in composition.

In order to achieve the fourth object mentioned above, the present inventors have come to accomplish the present invention upon acquiring the knowledge that in a submount, especially the adhesion strength between a submount substrate and each of layers formed thereon as affected, e.g., by the presence of a carbon compound in a surface region of the submount substrate, exerts an influence on an adhesion strength between the submount substrate and an electrode.

Thus, in order to attain the fourth object mentioned above, the present invention provides in a fourth aspect thereof a submount comprising: a submount substrate, an electrode layer formed on the submount substrate, and a solder layer formed on the electrode layer, characterized in that carbon concentration in at least one of the region adjacent to an interface formed between the submount substrate and the electrode layer and the region adjacent to an interface formed between the electrode layer and the solder layer is not more than $1 \times 10^{20}$ atoms/cm$^3$.

The present invention also provides a submount comprising: a submount substrate, a substrate protective layer formed on the submount substrate, an electrode layer formed on the submount substrate, and a solder layer formed on the electrode layer, characterized in that carbon concentration in at least one of the region adjacent to an interface formed between the submount substrate and the substrate protective layer, the region adjacent to an interface formed between the substrate protective layer and the electrode layer and the region adjacent to an interface formed between the electrode layer and the solder layer is not more than $1 \times 10^{20}$ atoms/cm$^3$.

The present invention further provides a submount comprising: a submount substrate, a substrate protective layer formed on the submount substrate, an electrode layer formed on the substrate protective layer, an adherent layer formed on the electrode layer, and a solder layer formed on the adherent layer, characterized in that carbon concentration in at least one of the region adjacent to an interface formed between the submount substrate and the substrate protective layer, the region adjacent to an interface formed between the substrate protective layer and the electrode layer, the region adjacent to an interface formed between the electrode layer and the adherent layer and the region adjacent to an interface formed between the adherent layer and the solder layer is not more than $1 \times 10^{20}$ atoms/cm$^3$.

Preferably, the solder layer has a solder protective layer formed thereon and carbon concentration in the region adjacent to an interface formed between the solder layer and the solder protective layer is not more than $1 \times 10^{20}$ atoms/cm$^3$. The submount substrate is preferably made of a nitride ceramic, which preferably is aluminum nitride.

By limiting the concentration of carbon atoms existing in each of the regions adjacent to interfaces between the submount substrate and the layer formed thereon and between such layers to not more than $1 \times 10^{20}$ atoms/cm$^3$, it is possible to increase the adhesion strength between the submount substrate and the electrode layer and that between the layers, thereby permitting the submount and the semiconductor device to be soldered together firmly. As a result, it is possible to reduce the temperature rise in the semiconductor device using the submount and thereby to improve its performance and service life.

In order to achieve the fourth object mentioned above, the present invention further provides a method of manufacturing a submount which comprises a submount substrate, an electrode layer formed on the submount substrate and a solder layer formed on the electrode layer, characterized in that the method comprises the step of cleansing at least one of respective surface regions of the submount substrate and the electrode layer on which the electrode layer and the solder layer are to be formed, respectively, so as to reduce carbon concentration in at least one of these surface regions.

When a substrate protective layer is formed between the submount and the electrode layer, the method preferably further comprises forming the step of cleansing at least one of respective surface regions of the submount substrate and the substrate protective layer on which the substrate protective layer and the electrode layer are to be formed, respectively, so as to reduce carbon concentration in at least one of these surface regions. Further, when an adherent layer is formed between the electrode layer and the solder layer, the method preferably comprises the step of cleansing respective surface regions of the electrode layer and the adherent layer on which the adherent layer and the solder layer are to be formed, respectively, so as to reduce carbon concentration in at least one of these surface regions. Further, when a solder protective layer is formed on the solder layer, the method preferably comprises the step of cleansing a surface of the solder layer which is to have the solder protective layer formed thereon, so as to reduce carbon concentration in this surface. The surface cleansing may be effected by one of ultraviolet ozonizing and plasma ashing processes.

According to these methods, submounts which excel in adhesion between a submount substrate and an electrode layer or adhesion between layers formed on the submount can be manufactured at low cost and with high yield.

In order to achieve the fifth object mentioned above, the present invention provides in a fifth aspect thereof a submount comprising a submount substrate and a solder layer adherently deposited on the submount substrate for soldering with a semiconductor device, characterized in that the solder layer is formed of constituent elements in a composition ratio which varies in a depth direction of the solder layer, i.e., varies as a function of depth of a position in the solder layer. With the composition ratio in which the solder layer is formed of elements varying in its depth direction, it is possible to widen the range of melting temperatures so as to extend from a melting temperature derived from composition of the solder layer at its front or obverse side to a melting temperature derived from composition of the solder layer down to its rear or reverse side. The solder layer which at a temperature above the melting start temperature will take its liquid phase containing state will, in soldering with a semiconductor device, have interdiffusion brought about with an electrode of the semiconductor device, enabling a junction to be formed which is sufficient to achieve a key function of the submount. Furthermore, it is possible to reduce the height of scramble-up of the solder layer when soldering with the semiconductor device.

Preferably, the composition ratio in which the solder layer is formed of elements varies in a depth direction of the solder layer so that the solder layer is lower in melting point on its obverse side where to join with a semiconductor device than on its reverse side. The difference in melting point between the obverse and reverse sides of the solder layer is preferably greater than 10° C. The solder layer may be made of an alloy of Sn with at least one of metals selected from the group which consists of Au, Ag, Cu, Zn, In, Bi, Fe, Pb, Ti, Al, Sb and Ni. The submount substrate may be made of one of aluminum nitride, silicon carbide and silicon.

According to such makeup, the height of scramble-up of the solder layer when soldering with a semiconductor device can be reduced.

In order to attain the fifth object mentioned above, the present invention further provides a method of manufacturing a submount in which a solder layer composed of a plurality of constituent elements is adherently deposited on a submount substrate for soldering a semiconductor device therewith, characterized in that the method comprises forming the solder layer by vapor deposition for each of the constituent elements so that the ratio of its composition varies in its direction.

Forming a solder layer whose composition varies in its depth direction, e.g., by simultaneous binary vapor deposition, allows a submount having the solder layer whose composition varies in its depth direction to be manufactured with high precision.

Effects of the Invention

According to the present invention in its first aspect, it is possible to improve the wettability of a solder layer and to firmly join the solder layer and a semiconductor device together with no flux. Accordingly, a submount having a semiconductor device mounted thereon can be obtained in which the semiconductor device is low in thermal resistance. This allows a semiconductor device used with a submount of the present invention to be low in temperature rise, improving the performance and service life of the semiconductor device. Also, the submount that may be fabricated by a lift-off process can be manufactured with high productivity and low cost.

According to the present invention in its second aspect in which the solder layer comprises a plurality of layers of solder which are different in melting point and a solder protective layer therefor, their melting start temperature, the melting start temperature of the solder protective layer and their complete melting temperature are all lowered, permitting the bonding temperature to be lowered as well. To wit, a submount can be provided in which the requirement of raising the meltability of a solder layer itself by melting the solder divided in two or more stages by the time the temperature is elevated to the soldering temperature can be reconciled with the requirement of easily melting a solder protective layer provided to prevent oxidation of the uppermost surface of the solder layer.

According to the present invention in its third aspect in which the solder layer has a composition which is determined by its constituent elements and other than a eutectic composition thereof, and has a difference in temperature existing between its melting start temperature and its full melting temperature, the range of temperature for bonding the solder layer and a semiconductor device together can be widened. Accordingly, a submount can be obtained which is low in bonding variation for semiconductor devices to be mounted thereon.

According to the present invention in its fourth aspect, submounts can be provided which excel in adhesion between a submount substrate and an electrode layer or adhesion between layers formed on the submount. Especially, since an improved adhesion can be obtained even with noble metal not much used, the manufacturing process steps and cost can be reduced. Therefore, submounts can be manufactured with high productivity and low cost.

According to the present invention in its fifth aspect in which the composition of a solder layer is varied in its depth direction to provide a difference in melting point between its obverse and reverse side, the range of temperature for bonding the solder layer and a semiconductor device together can be widened. Accordingly, a submount can be obtained which is low in bonding variation for semiconductor devices to be mounted thereon and which has the effect that the amount of a molten portion of the solder layer, namely of its liquid phase may be adjusted as desired, the submount being obtainable in which the height of scramble-up of the solder layer over a semiconductor device to be soldered therewith. Thus, a short-circuit failure liable to occur with the solder's scramble-up growing in height.

DESCRIPTION OF REFERENCE CHARACTERS

Figure 1:
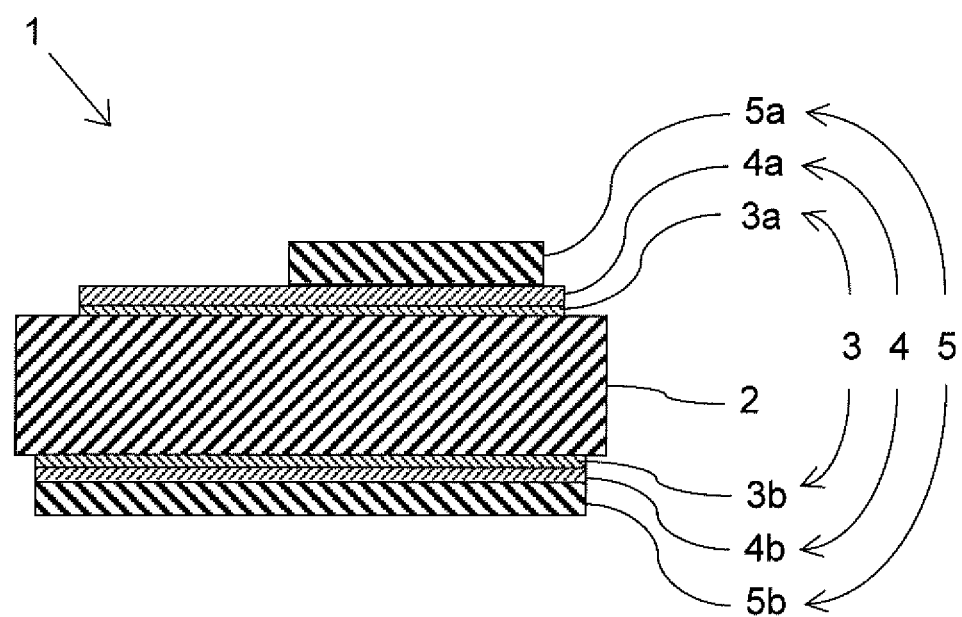
FIG. 1 is a cross sectional view diagrammatically illustrating a structure of a submount according to a first form of implementation of the present invention.

In the Figures, reference characters designate:
1, 10, 20, 30, 40, 42, 44, 50: Submount
2, 12, 22, 32, 52: Submount Substrate
3 (3a, 3b), 35 (35a, 35b): Substrate Protective Layer
4 (4a, 4b), 15, 33 (33a, 33b): Electrode Layer
5 (5a, 5b), 13, 34 (34a, 34b): Solder Layer
5c, 24a, 34c: Region where the Solder Layer is Peeled Off
5d, 24b: Peeled Solder Layer
7: Semiconductor Device (Light Emitting Diode)
14, 38: Solder Protective Layer
23, 53: Electrode Layer on the side where Device is mounted
24, 54: Solder Layer on the side where Device is mounted
25, 55: Electrode Layer on the side of Metal Heat Sink
26, 56: Solder Layer on the side of Metal Heat Sink
31, 51: Submount Substrate before Splitting
36 (36a, 36b): Adherent Layer
37, 57: Dicing Line

BEST MODES FOR CARRYING OUT THE INVENTION

Hereinafter, an explanation will be given of structures of submounts according to various forms of the present invention with reference to the Drawing Figures.

FIG. 1 is a cross sectional view diagrammatically illustrating a structure of a submount according to a first form of implementation of the present invention. In the submount 1 as shown in FIG. 1, a submount substrate 2 has on one or each of its both sides an electrode layer 4 formed to cover the submount substrate 2 in part or wholly via a substrate protective layer 3. The electrode layer 4 has a solder layer 5 formed on a surface thereof. The solder layer 5 may be formed on the electrode layer 4 in an entire surface thereof as with, e.g., a light emitting diode or in a patterned electrode area. Also, a gold wire may be connected to a portion of the electrode layer 4 to form an electric circuit.

The submount substrate 2 may be composed of high thermal conductivity material such as aluminum nitride (AlN), silicon carbide (SiC), diamond IIa or the like. Also, the submount substrate 2 may have a side face thereof formed with an electrode layer, too, as above and may then have its top and bottom connected together electrically.

The substrate protective layer 3 in making the submount 1 is first formed to cover an entire surface of the submount substrate 2 and is provided to prevent the surface of the submount substrate 2 from being roughened by etching or the like in the step of patterning the electrode layer 4 and the solder layer 5. The substrate protective layer 3 is desirably high in adherence to the submount substrate 2 and different in kind of metal from the electrode layer 4 as described later and may be composed of anyone of titanium (Ti), platinum (Pt), nickel (Ni), tungsten (W), molybdenum (Mo), silver (Ag), copper (Cu), iron (Fe), aluminum (Al) and gold (Au). Also, it may contain two or more of these metals. For example, Ti and Pt may be layered on the submount substrate 2.

The electrode layer 4 is desirably made of metal and may be composed of anyone of gold, platinum, silver, copper, iron, aluminum, titanium and tungsten. Also, it may contain two or more of these metals. For example, Ag and Au may be layered on the substrate protective layer 3.

The solder layer 5 is desirably of a solder free of lead (Pb), namely a Pb free solder. Furthermore, the solder may preferably contain two or more of elements of the group which consists of silver, gold, copper, zinc (Zn), nickel (Ni), indium (In), gallium (Ga), bismuth (Bi), aluminum and tin (Sn).

There may be disposed an adherent layer (not shown) between the electrode layer 4 and the solder layer 5 to enhance the adhesion between them. The adherent layer is suitably composed of titanium.

The electrode layer 4 should desirably have a surface roughness (Ra) of less than 0.1 μm, especially less than 0.05 μm to raise wettability of the solder layer 5a. If the surface roughness of the electrode layer 4 is 0.1 μm or more, the wettability of the solder layer 5a has been found to become poor, bringing about a junction failure.

Likewise the surface roughness of the electrode layer 4, the submount substrate 2 should desirably have a surface roughness (Ra) of less than 0.1 μm, especially less than 0.05 μm. It has been found that the wettability of the surface of the electrode layer 4 cannot be raised unless the submount substrate 2 is made equal in surface roughness to the electrode layer 4.

A pattern of a metal layer as the substrate protective layer 3 may be formed on the submount substrate 2 by etching in photolithography. If the surface roughness of the submount substrate 2 becomes large in this etching, it is not desirable because the surface roughness of the electrode layer 4 formed on the substrate protective layer 3 becomes large, too. Therefore, the surface roughness (Ra) of the submount substrate 2 where such electrode layer 4 is not disposed, i.e., which is not covered with the electrode layer 4 but is exposed to the surface, should be also less than 0.1 μm, preferably less than 0.05 μm in order for the electrode layer 4 to have an average surface roughness of less than 0.1 μm. If the surface roughness of the submount substrate 2 is 0.1 μm or more, it is not desirable because the surface roughness of the electrode layer 4 will then be 0.1 μm or more.

Further, the absolute value of a differential in average surface roughness (Ra) between the exposed submount substrate 2, i.e. not covered with the electrode layer 4, and the electrode layer 4 is not more than 0.02 μm. If the absolute value of a differential in average surface roughness (Ra) is more than 0.02 μm, it is not desirable because the adherence between the electrode layer 4 and the submount substrate 2 will then deteriorate.

Figure 2:
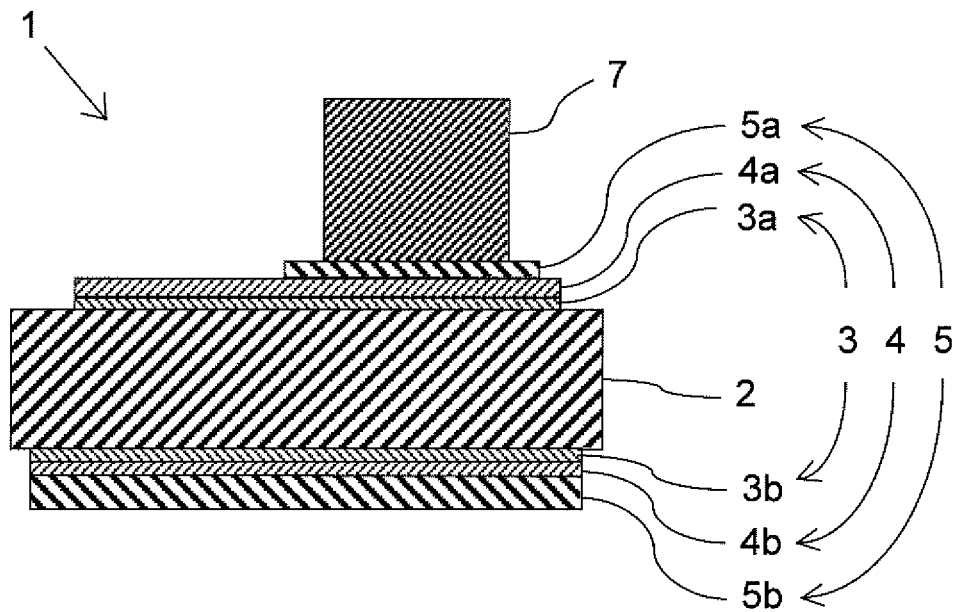
FIG. 2 is a cross sectional view diagrammatically illustrating a structure of the submount of FIG. 1 having a semiconductor device mounted thereon.

Mention is next made of mounting a semiconductor device on a submount according to the present invention. FIG. 2 is a cross sectional view diagrammatically illustrating a structure of the submount of the present invention having a semiconductor device 7 mounted thereon. As shown in FIG. 2, the semiconductor device 7 is mounted on the submount 1 by being soldered therewith via solder of the solder layer 5a without flux. Here, the semiconductor device may include light emitting device such as laser diode or light emitting diode, a diode, an active element such as transistor or thyristor for use in high frequency amplification or switching and an integrated circuit.

A feature of the submount 1 of the present invention is that the submount substrate should have an average surface roughness of less than 0.1 μm, preferably less than 0.05 μm or that in addition, the electrode layer 4 formed thereon should have a surface roughness of less than 0.1 μm. As a result, the solder layer 5a is raised in its wettability and improved in its bondability with the semiconductor device 7. To wit, the solder layer 5a beneath the semiconductor device 7 is rendered voidless and uniform. Moreover, a junction of solder layer with a minimum thickness can be obtained. With the submount so configured, a junction small in thermal resistance can be formed. This allows a semiconductor device used with the submount 1 of the present invention to be low in thermal resistance and improved in performance and service life.

Mention is made of a method of manufacturing the submount in accordance with the present invention.

A submount substrate 2 is prepared and its both surfaces are ground by a lapping machine. Then, the submount substrate 2 is finished by a polishing machine to have an average surface roughness (Ra) of less than 0.1 μm, preferably less than 0.05 μm.

Next, the finished submount substrate 2 is washed to clean its whole surfaces, and a substrate protective layer 3a is formed onto the whole surface of the submount substrate 2. The substrate protective layer 3a can be formed by vapor deposition using a vacuum evaporation or sputtering apparatus.

Subsequently, patterning is performed by photolithography. Specifically, a resist is coated uniformly over a whole surface of the submount substrate 2 using a spinner and thereafter is baked in a baking furnace and then subjected to γ-ray contact exposure using a mask aligner. After exposure, a portion of the resist where an electrode layer 4a is to be formed is dissolved using a tetramethylamine family developer to expose the substrate protective layer 3a.

Next, a metal becoming an electrode layer 4a is deposited by vapor deposition in the vacuum evaporator and the entire resist is dissolved using acetone to remove a portion of the metal other than the electrode layer 4a by lift-off and thereby to form the electrode layer 4a. Subsequently, a solder layer 5a is formed on a portion of the electrode layer 4a that was formed on the surface of the submount substrate 2 using photolithography and lift-off with the vacuum evaporator as for the electrode layer 4a.

Next, the substrate protective layer 3a exposed on the surface of the submount substrate 2 is removed by etching to expose the surface of the submount substrate 2. Finally, the submount substrate 2 obtained is split using a dicing machine into submounts of a desired size.

The feature of the method of manufacturing a submount 1 in accordance with the present invention is that the submount substrate 2 is coated over a whole surface thereof with the substrate protective layer 3 to effectively prevent the surface of the submount substrate 2 from being roughened when the electrode layer 4 and the solder layer 5 are patterned by the lift-off process. This allows the submount substrate 2 having an average surface roughness of less than 0.1 μm, preferably of less than 0.05 μm to form the electrode layer 4 thereon having a surface roughness of 0.1 μm, especially of less than 0.05 μm and having an improved wettability. According to the method of manufacturing a submount 1 in accordance with the present invention, it is possible to manufacture submounts 1 excellent in bondability with semiconductor devices 7 with high yield.

Example 1

Mention is made below of further details of the present invention with reference to specific examples thereof. First, the method of manufacturing a submount is explained.

Both faces of a sintered aluminum nitride substrate 2 of 55 mm square and 0.3 mm thick having a high thermal conductivity (230 W/mK) were ground with a lapping machine and finished with a polishing machine to have an average surface roughness (Ra) of 0.07 μm.

The finished aluminum nitride substrate 2 was washed to clean its surfaces, and a substrate protective layer 3a of titanium was deposited onto the whole surface of the substrate 2 by a vacuum evaporator to a thickness of 0.05 μm.

Subsequently, to perform patterning by photolithography, a resist was coated uniformly over a whole surface of the submount substrate 2 using a spinner and thereafter was baked as desired in a baking furnace and then subjected to γ-ray contact exposure using a mask aligner. A mask for the exposure was designed so that 2,500 pieces of submount each of 1 mm square submount size could be patterned at the same time. After the exposure, a portion of the resist where an electrode layer 4a was to be formed was dissolved using a tetramethylamine family developer to expose the substrate protective layer 3a.

Next, gold (Au) becoming an electrode layer 4a was deposited over the whole substrate surface by vapor deposition in the vacuum evaporator and the entire resist was dissolved using acetone to remove a portion of Au other than the electrode layer 4a by lift-off and thereby to form the electrode layer 4a desired. The electrode layer 4a had a thickness of 0.1 μm and a size of 800 μm square on each face.

Then, a solder layer 5a of 5 μm was formed on a portion of the electrode layer 4a which was formed on the surface of the aluminum nitride substrate 2 using photolithography and the vacuum evaporator as where the electrode layer 4a was formed. The solder layer 5a had constituents of Ag and Sn and a size of 400 μm square on the side for bonding to a semiconductor device and 800 μm square on the submount bonding side.

After the solder layer 5a was formed, the substrate protective layer 3a exposed to the surface was removed by etching with dilute fluoric acid to expose the surface of the aluminum nitride substrate 2. Finally, the aluminum nitride substrate 2 obtained was cut using a dicing machine into submounts of a 1 mm square submount 1 size. A submount 1 of Example 1 was thus made.

Example 2

A submount 1 of Example 2 was made in the same manner as of Example 1 except that an aluminum nitride substrate 2 was used having an average surface roughness (Ra) of 0.04 μm.

Next, mention is made of comparative examples.

Comparative Example 1

A submount of Comparative Example 1 was in the same manner of Examples 1 and 2 except that an aluminum nitride substrate 2 was used having an average surface roughness (Ra) of 0.13 μm.

Comparative Example 2

A submount of Comparative Example 2 was in the same manner of Examples 1 and 2 and Comparative Example 1 except that an aluminum nitride substrate 2 was used having an average surface roughness (Ra) of 0.07 μm and then an electrode layer 4a was formed under altered conditions of the vapor deposition to have its surface intentionally roughened.

Properties of the submounts obtained in Examples and Comparative Examples above are mentioned.

The surface roughness (Ra) of the submount substrate 2 and that of the electrode layer 4a of each of submounts 1 made in Examples and Comparative Examples were measured by a stylus type roughness meter. Table 1 shows properties in Examples and Comparative Examples. As seen from Table 1, in Examples 1 and 2, the average surface roughness (Ra) of the submount substrate 2 had values of 0.07 μm and 0.04 μm, respectively and the surface roughness of the electrode layer 4a had values of 0.06 μm and 0.03 μm, respectively. In comparison, in Comparative Examples 1 and 2, the average surface roughness (Ra) of the submount substrate 2 had values of 0.13 μm and 0.07 μm, respectively and the surface roughness of the electrode layer 4a had values of 0.12 μm and 0.18 μm, respectively. It is seen that the average surface roughness (Ra) of the submount substrate 2 has values not more than 0.07 μm in the Examples and that has values around 0.1 μm in the Comparative Examples. Likewise, it is seen that the average surface roughness (Ra) of the electrode layer 4a has values less than 0.06 μm in the Examples and that has values more than 0.1 μm in the Comparative Examples.

TABLE 1

| | Substrate Surface Roughness (Ra) (μm) | Electrode Surface Roughness (Ra) (μm) | Wetting Extendibility | Peeling-off Sate |
| --- | --- | --- | --- | --- |
| Example 1 | 0.07 | 0.06 | 1.10 | No peeling-off |
| Example 2 | 0.04 | 0.03 | 1.15 | No peeling-off |
| Con. Ex. 1 | 0.13 | 0.12 | 1.05 | Peeled off between Electrode Layer and Substrate |
| Con. Ex. 2 | 0.07 | 0.18 | 1.01 | Peeled off between Electrode Layer and Substrate |

Next, wetting extendibility of solder when it is bonded is evaluated. The wetting extendibility is a property that can be evaluated in terms of the ratio of areas of the solder layer 5a changing between before and after the solder layer 5a is melted, as viewed from top of the solder layer 5a. The better the wettability, the larger has the area of the solder that is melted; and the better the wetting extendibility to be. The wettability is evaluated specifically by heating the bottom of the submount 1 with a halogen lamp heater that is precise in temperature adjustability to cause the solder layer 5a to be molten and evaluating the extendibility of the melt.

As is apparent from Table 1, the wetting extendibility had values of 1.10 and 1.15, more than 1.10, in Examples 1 and 2 while the wetting extendibility had values of 1.05 and 1.01 in Comparative Examples 1 and 2, respectively. It has thus been seen that the wetting extendibility of the solder layer 5a is larger in the Examples than in the Comparative Examples. In the Examples, the result is obtained that the wetting extendibility is larger than 1.1 with the electrode layer 4a whose surface roughness is smaller.

Next, soldering properties between each of the submounts in Examples 1 and 2 and Comparative Examples 1 and 2 above and a semiconductor device will be mentioned.

Samples were prepared to clarify the relationship between solder bonding strength and solder wetting extendibility. A sample was prepared that the solder layer 5a of a submount 1 is molten by heating equipment, a semiconductor device 7 was placed above, it was bonded to the solder layer 5a and it was then cooled. The samples were subjected to a tape peeling test with an evaluating tape and their peel-off states were observed. Here, a light emitting diode was used as the semiconductor device 7. The samples for each of the Examples and Comparative Examples were 100 pieces.

Figure 3:
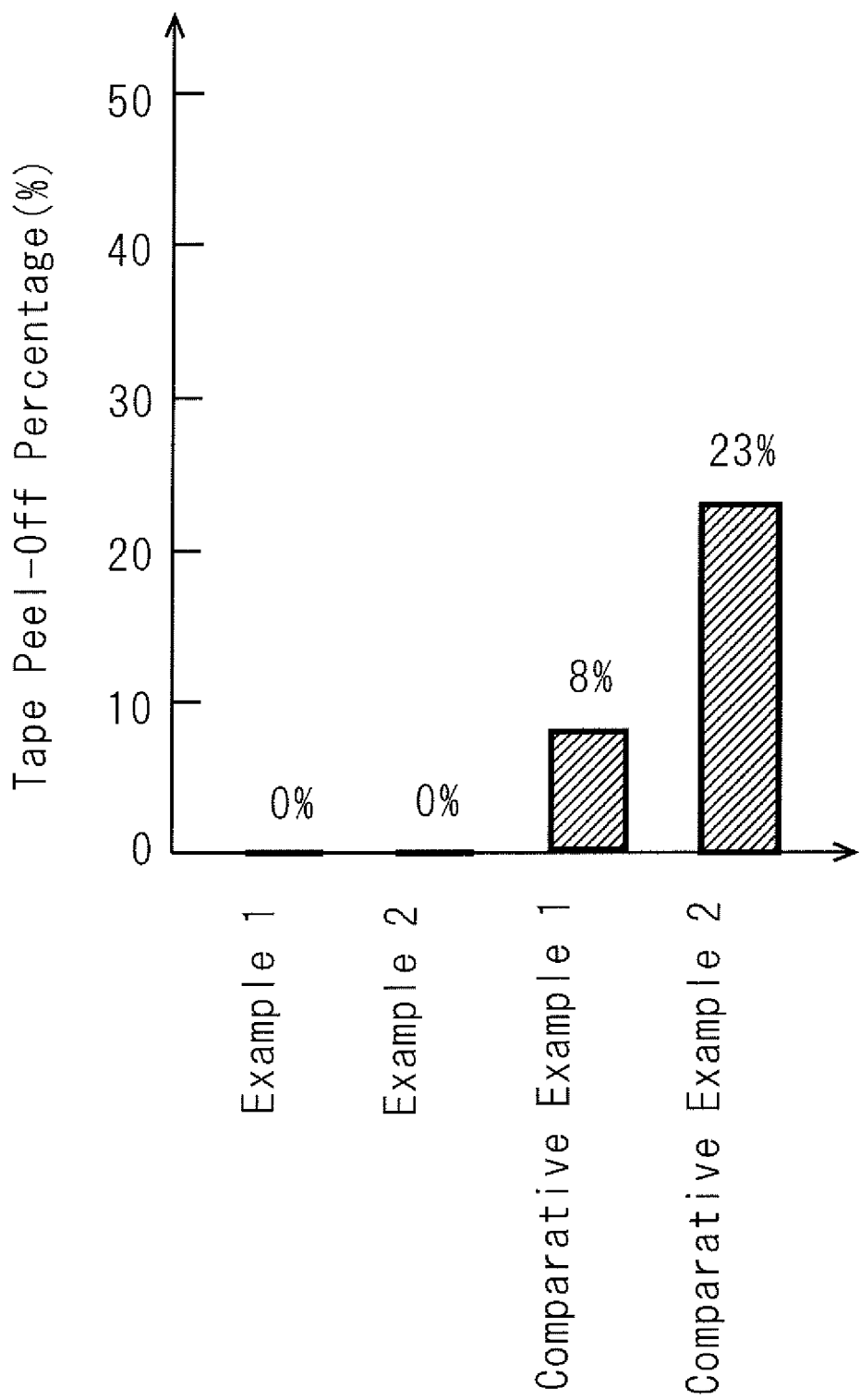
FIG. 3 is a graph illustrating percentages of tape peeling-off in Examples 1 and 2 and Comparative Examples 1 and 2.

FIG. 3 is a graph illustrating percentages of tape peeling-off in Examples 1 and 2 and Comparative Examples 1 and 2. In the graph, the ordinate axis represents the percentage (%) of tape peeling-off. It is apparent from the graph that in Examples 1 and 2, the light emitting diode 7 was not pealed off if the tape was peeled off. In Comparative Examples 1 and 2, however, percentages of tape peeling-off were 8% and 23%, respectively, showing that a light emitting diode 7 could easily be peeled off. In each of the Comparative Examples, the tape with the light emitting diode was peeled off at an interface between the solder layer 5a and the electrode layer 4a, indicating that the bonding force between the solder layer 5a and the electrode layer 4a was low.

Figure 4:
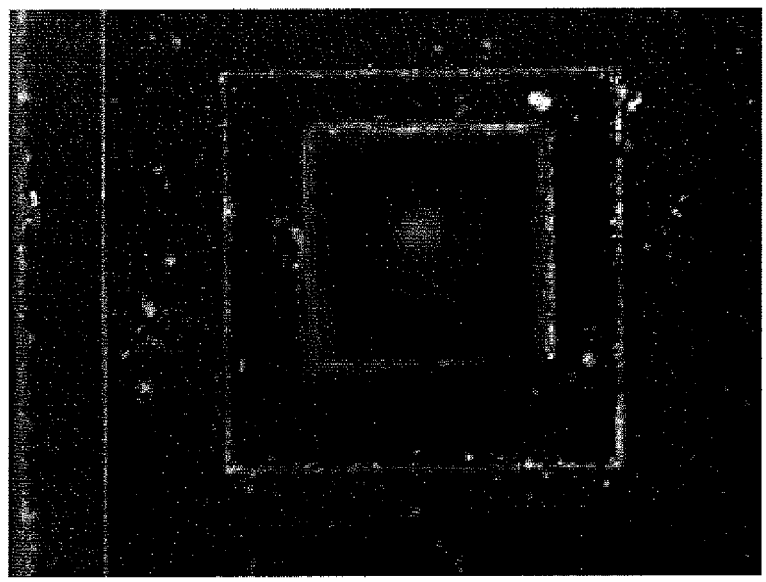
FIG. 4 shows at (A) an optical microscopic image taken in observation from top of a submount after a tape peeling test in Examples 1 and 2 and at (B) an explanatory view thereof.
Figure 4:
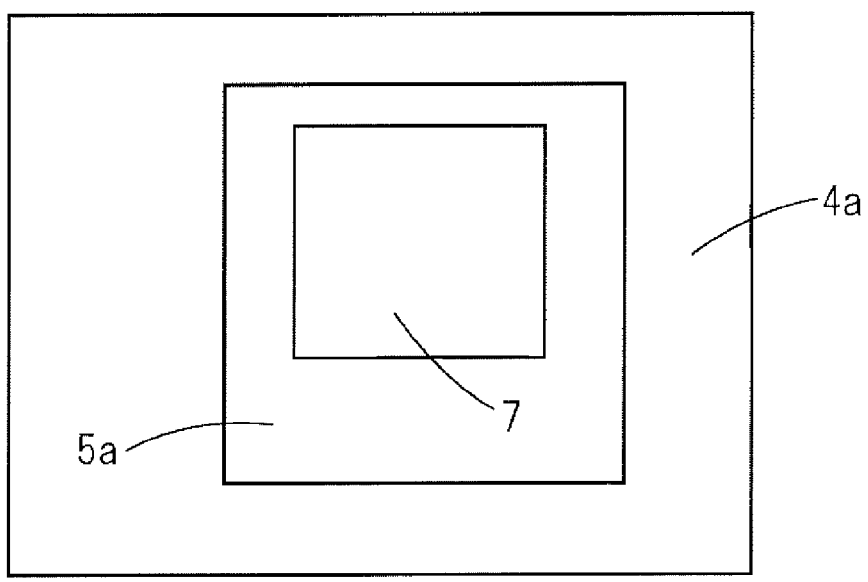

FIG. 4 shows at (A) an optical microscopic image taken in observation from top of a submount after a tape peeling test in Examples 1 and 2 and at (B) an explanatory view thereof. The magnification is 181. As is apparent from FIG. 4, it is seen that the light emitting diode 7 remains bonded to the solder layer 5a formed on the electrode layer 4a with no peeling-off occurring anywhere.

Figure 5:
FIG. 5 shows at (A) an optical microscopic image taken in observation from top of a submount having a light emitting diode peeled off in the tape peeling test in Comparative Examples 1 and 2 and at (b) an explanatory view thereof.
Figure 5:
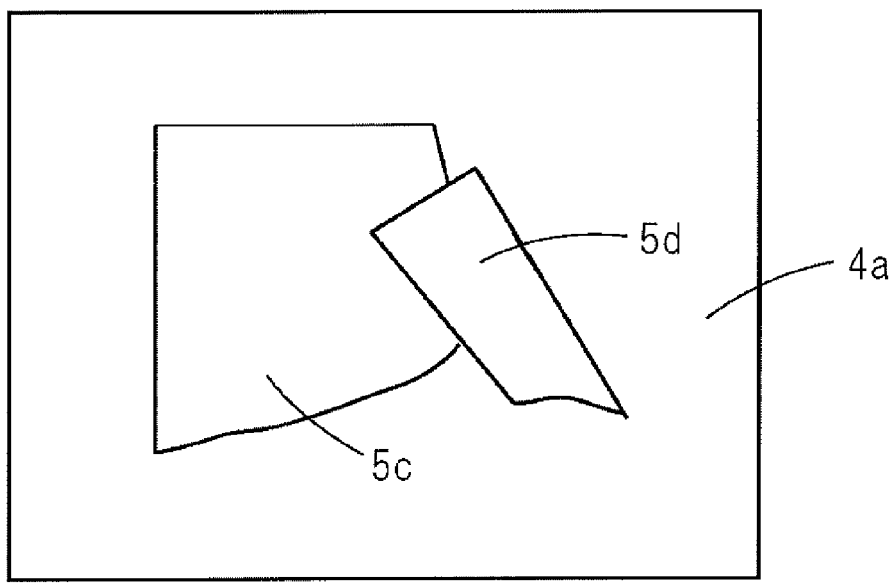

FIG. 5 shows at (A) an optical microscopic image taken in observation from top of a submount having a light emitting diode peeled off in the tape peeling tests in Comparative Examples 1 and 2 and at (b) an explanatory view thereof. The magnification is 181. From FIG. 5, it is seen that there are portion 5d in which solder layer 5a formed on the electrode layer 4a of gold was peeled off and the peeled solder layer 5d. And, it is seen that the breakage and peeling-off occurred at the interface between the electrode layer 4a and the solder layer 5a with the result that the light emitting diode 7 was peeled off.

According to the above Examples 1 and 2 and Comparative Examples in a submount 1 for having a semiconductor device 7 mounted thereon, the high wettability of the solder layer 5a was realized by adjusting the surface roughness of submount substrate 2 and the electrode layer 4a. As a result, the semiconductor device 7 and the solder layer 5a were firmly bonded together without using any flux.

Next, a second form of implementation of the present invention will be explained.

Figure 6:
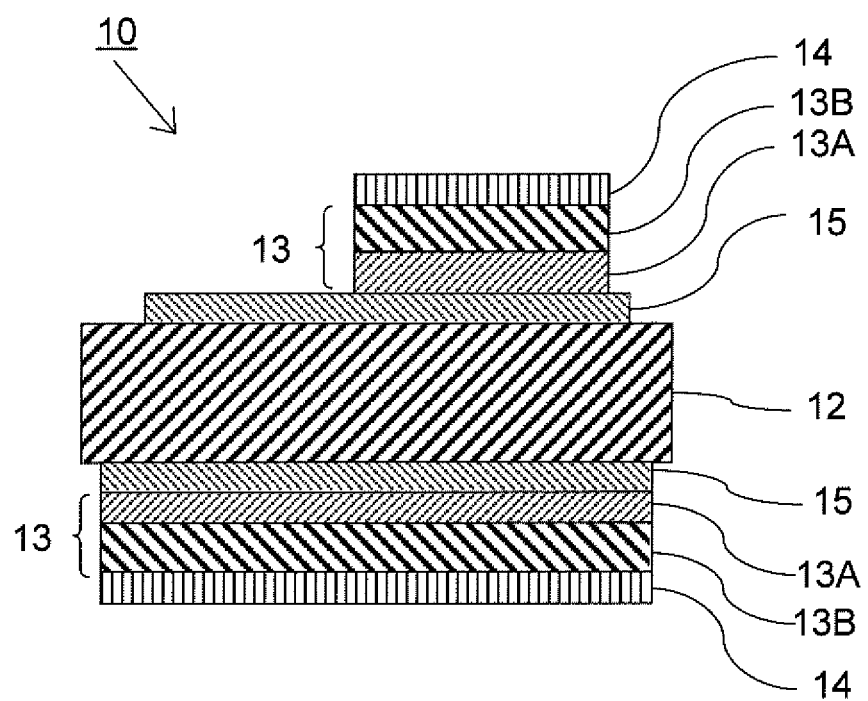
FIG. 6 is a cross sectional view diagrammatically illustrating a structure of a submount according to a second form of implementation of the present invention.

FIG. 6 is a cross sectional view diagrammatically illustrating a structure of a submount 10 according to the second form of implementation of the present invention. In the submount 10 shown in FIG. 6, a submount substrate 12 has on one or each of its both sides a solder layer 13 formed to cover a part or whole thereof. The solder layer 13 is divided into a solder layer 13A and a solder layer 13B that vary in composition. Since the solder layers 13A and 13B vary in composition, their melting points are different. A solder protective layer 14 is formed onto the uppermost surface of the solder layer 13. While two solder layers 13A and 13B having different melting point are shown, the solder layer 13 may be comprised of more than two solder layers if varying in melting point.

Beneath the solder layer 13 there may be formed an electrode layer 15 which is high in adherence to the submount substrate 12. There may be disposed an adherent layer (not shown) between the electrode layer 15 and the solder layer 13A to further enhance the adherence when they are formed. The adherent layer can be composed of Ti (titanium), Pt (platinum) or the like. The submount substrate 12 may have a side face thereof formed with an electrode layer, too, in a manner as mentioned above and may then have its top and bottom connected together electrically. A gold wire may be connected to a portion of the electrode layer 15 to form an electric circuit.

Each layer 13A, 13B of the solder layer 13 is desirably of a solder not containing Pb, a so-called Pb free solder, desirably containing two or more elements selected from the group which consists of Ag, Au, Cu, Zn, Ni, In, Ga, Bi, Al and Sn.

Here, while the layers of solder 13A and 13B are varied in composition to have different melting point, the solder may be a solder containing Au and Sn or Ag and Sn, or a solder containing Ag, Au and Sn. Also, the solder 13 may be comprised of two layers. In this case, one layer of the two solder layer is containing more than 50% of Au element and the other layer of solder layer is containing less than 50% of Au element. Likewise, one of the two layers may be a layer of solder containing more than 50% of Au and Ag elements and the other of the two layers may be a layer of solder containing less than 50% of Au and Ag elements.

The electrode layer 15 is desirably of a metal such as one of Au, Pt, Ag, Cu, Fe, Al, Ti and W. The solder protective layer 14 is desirably of a noble metal such as Au, Pt or Ag. Au is particularly preferred.

Next, mounting a semiconductor device on the submount of the second form of implementation will be explained.

Figure 7:
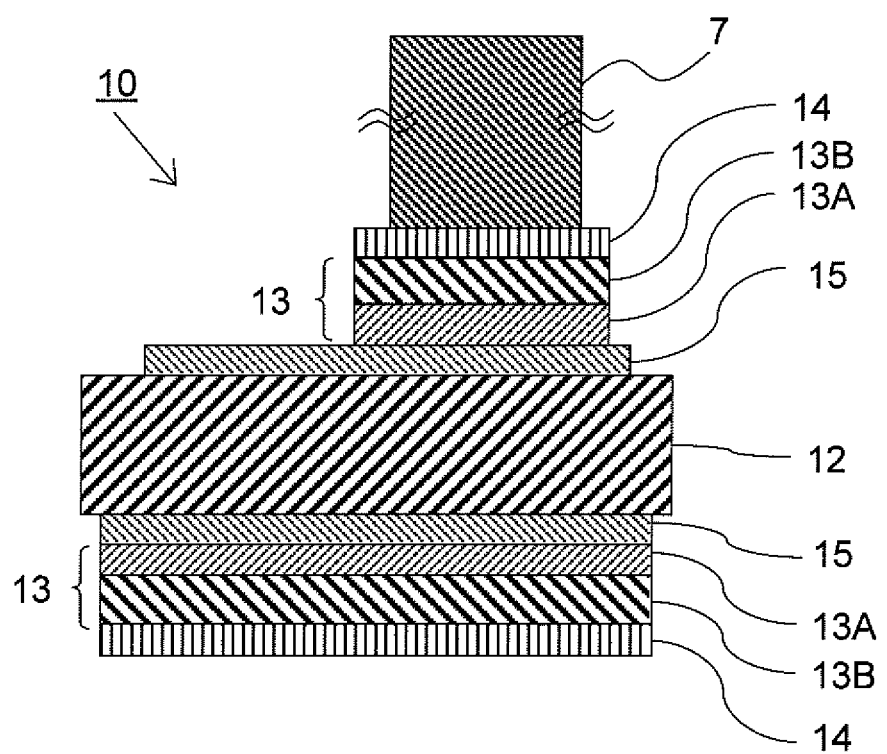
FIG. 7 is a cross sectional view diagrammatically illustrating a structure of the submount of FIG. 6 having a semiconductor device mounted thereon.

FIG. 7 is a cross sectional view diagrammatically illustrating a structure of the submount of FIG. 6 having a semiconductor device 7 mounted thereon. In the submount 10 shown in FIG. 7, the semiconductor device 7 is soldered with the solder layer 13. The semiconductor device 7 may include light emitting devices such as laser diode or light emitting diode, a diode, an active element such as transistor or thyristor for use in high frequency amplification or switching and an integrated circuit.

The submount 10 of the second form of implementation features that the solder layer 13 comprises two or more solder layers varying in melting temperature and the solder protective layer 14 provided on the uppermost layer of the solder layer 13. Now, let it be assumed that the solder layer 13 is comprised of two layers 13 and 13B varying in melting point, the melting point of the solder layer 13A on the side of the electrode layer 15 is higher than that of the solder layer 13B formed thereon and the melting point of the solder protective layer 14 is higher than that of both the solder layers 13A and 13B. And, assume that the solder protective layer 14 is a metal that can be molten into the solder layers 13A and 13B.

Then, if heating is effected in order to bond the semiconductor device 7 and the solder layer 13 together, the solder layer 13B that is the lowest in melting point will first melt and the solder layer 13A will then melt. When the solder layer B that is the lowest in melting point reaches its melting start temperature and starts to melt, the solder protective layer 14 above the solder layer 13B will be caused to start interdiffusion with a liquid phase of the solder layer B, thereby starting to melt. Likewise, when the solder layer 13B that is the lowest in melting point starts to melt, the solder layer 13A that is higher in melting point will be caused to have started interdiffusion with that liquid phase, thereby starting to melt. The temperature at which the solder layers 13A and 13B and the solder protective layer 14 all melt is designated to be complete melting temperature. They reach to the complete melting temperature by being heated, they will have completed melting, and they will cause the semiconductor device 7 and the solder layer 13 to be bonded firmly together as cooling to room temperature.

In the submount 10 of the second form of implementation in which the solder layer 13 has the structure of a plurality of layers different in melting point and its uppermost layer is covered with the solder protective layer 14, its melting start temperature, the melting start temperature of the solder protective layer 14 and their complete melting temperature are all lowered with the result that the bonding temperature can be lowered. To wit, by causing the solder layer 13 to be molten as divided in two or more stages while the bonding temperature is being reached, both the effects that the meltability of the solder layer 13 itself can be raised and that the solder protective layer 14 provided to inhibit oxidation of its surface can easily be molten. According to this form of implementation, it is possible to provide a submount that has a bonding strength sufficient at a low temperature for a semiconductor device 7 to operate. Accordingly, it is possible to form a junction that is low in thermal stress. That is, it is possible to reduce the residual thermal strain generated by cooling in soldering or bonding. As a result, a semiconductor device for use with the submount 10 can have its thermal stress reduced and its performance and service life also improved.

Example 3

Further details of the present invention with reference to specific examples thereof will be explained below. First, a method of manufacturing a submount of Example 3 is described.

Both surfaces of sintered aluminum nitride substrate (55 mm square and 0.3 mm thick) having a high thermal conductivity (230 W/mK) were ground by using a lapping machine. And, the final polishing was finished with a polishing machine. The finished aluminum nitride substrate 12 was washed to clean its surfaces. To perform patterning by photolithography, a resist was coated uniformly over a whole surface of the submount substrate 12 using a spinner, thereafter was baked as desired in a baking furnace. Then it was subjected to γ-ray contact exposure using a mask aligner. A mask for the exposure was designed so that 2,500 pieces of submount each of 1 mm square submount size could be patterned at the same time. After the exposure, a portion of the resist where an electrode layer was to be formed was dissolved using a liquid developer to expose the submount substrate 12.

Ti to 0.05 μm and then Au to 0.1 μm were deposited by vapor deposition equipment. The entire resist was dissolved using acetone to remove a portion of Au other than the electrode layer 15 by lift-off and thereby to form the electrode layer 15 of a desired pattern. The electrode layer 4a had a size of 800 μm square on each surface.

Next, using the photolithography and a vacuum evaporator equipped with two electron guns, a solder layer 13 and a solder protective layer 14 were formed on a portion of the electrode layer 15 on the front surface side of the submount substrate 12 while forming a pattern. The solder layer 13 had constituents of Au and Sn, which were simultaneously vapor-deposited with the two electron guns to form a solder layer 13A having a thickness and a composition selected. Thereafter, by changing the vapor deposition conditions to alter the solder composition, a solder layer 13B of a selected thickness was formed. Au was used to form the solder protective layer 14. The solder layer 13 had a size of 400 μm square on its side for bonding to a semiconductor device and 800 μm square on its back substrate bonding side. Finally, the submount substrate 12 was cut using a dicing machine into submounts of a preselected 1 mm square submount size.

As shown in Table 2, the solder layer 13A of Example 3 had an atomic composition ratio of Au:Sn=18.6:81.4 and a thickness of 3.5 μm. The solder layer 13B had a composition of Sn in 100% and a thickness of 0.5 μm. The solder protective layer 14 had a thickness of 0.05 μm. The solder layers 13A and 13B and the solder protective layer 14 in total had an atomic composition ratio of Au:Sn=18.0:82.0 and their total thickness was 4.05 μm.

Example 4

A submount of Example 4 was made in the same manner as in Example 4 except that solder layer different in composition was used. The solder layers 13A and 13B in Example 4 had an atomic composition ratios of Au:Sn=6.3:93.7 and Au:Sn=70.0:30.0, respectively. The solder layers 13A and 13B and the solder protective layer 14 in total had an atomic composition ratio of Au:Sn=18.0:82.0 as in Example 3 and their total thickness was 4.05 μm (see Table 2). Thus, in each of Examples 3 and 4, the solder layers 13A and 13B contained more than 50% of Au and less than 50% of Au, respectively.

Next, Comparative Examples 3 and 4 will be mentioned.

Comparative Example 3

A submount was prepared in the same manner as in Example 3 except that the solder layer 13 was a single layer 13A which had an atomic composition adjusted so as to be Au:Sn=16.5:83.5. In Example 3, the solder layer 13A and a solder protective layer 14 in total had the same elemental composition of Au:Sn=18.0:82.0 as in Example 3 and a thickness of 4.05 μm.

Comparative Example 4

As Comparative Example 4, a submount of a structure as in the prior art was prepared. Without using any solder protective layer 14, the submount was made in the same process as in Example 3. A solder layer 13 in Comparative Example 4 had the same atomic composition in total of Au:Sn=18.0:82.0 as in Example 3. Further, in all of Examples 3 and 4 and Comparative Examples 3 and 4, the atomic composition and the thickness in total of the solder layer 13 plus the solder protective layer 14 or of the solder layer 13 were each made identical.

Properties of the submounts prepared in Examples 3 and 4 and Comparative Examples 3 and 4 will be explained.

The molten state of a solder layer 13 formed on the submount 10 and the bonding strength of a semiconductor device 7 soldered to the submount 10 were evaluated. The molten state of the solder layer 13 was evaluated visually observing the melting behavior of the molten solder layer 13. The solder layer 13 was heated to be molten from the bottom of the submount 1 by using a halogen lamp heater that is precise in temperature adjustability. Also, in determining the melting temperatures, a differential scanning calorimeter (DSC) was used to measure the melting states.

Table 3 shows the molten states of Examples 3 and 4 and Comparative Examples 3 and 4, indicating the melting temperatures of materials of the solder layers themselves, the

TABLE 2

| | Solder Layer 3A | | | Solder Layer 3B | | | Solder Protective Layer 4 | | Entire Solder | | |
|---|---|---|---|---|---|---|---|---|---|---|---|
| | Comp. (at %) | | Thick | Comp. | | Thick | Comp | Thick | Comp. | | Thick |
| | Au | Sn | (μm) | Au | Sn | (μm) | Au | (μm) | Au | Sn | (μm) |
| Ex. 3 | 18.6 | 81.4 | 3.5 | 0 | 100 | 0.5 | 100 | 0.05 | 18 | 82 | 4.05 |
| Ex. 4 | 6.3 | 93.7 | 3.5 | 70 | 30 | 0.5 | 100 | 0.05 | 18 | 82 | 4.05 |
| C. Ex. 3 | 16.5 | 83.5 | 4 | | | | 100 | 0.05 | 18 | 82 | 4.05 |
| C. Ex. 4 | 0 | 100 | 3.58 | 100 | 0 | 0.49 | | | 18 | 82 | 4.05 | order of the solders melting and the melting temperatures determined from the DSC measurements.

TABLE 3

| | Layer Melting Temperature (° C.) | | Melting Order Actual State observed | | Melting Temperature (DSC, ° C.) | | |
|---|---|---|---|---|---|---|---|
| | Solder Layer 3A | Solder Layer 3B | First | Second | Start melting | Protective Layer melting | Complete Melting |
| Ex. 3 | 280 | 232 | S.L.3B | S.L.3A | 242 | 260 | 280 |
| Ex. 4 | 220 | 280 | S.L.3A | S.L.3B | 230 | 270 | 280 |
| C. Ex. 3 | 275 | | S.L.3A | | 275 | 277 | 285 |
| C. Ex. 4 | 232 | 1063 | S.L.3A | S.L.3B | 242 | 280 | 315 |

S.L.: solder layer

In Example 3, the visual observation indicated that the solder layer 13B melted first and then the solder layer 13A melted. The DSC measurement indicated that the solder layer 13B started to melt at 242° C., then the solder protective layer 14 started to melt into the solder layer 13B at around 260° C., and the entire solder layer 13 started to melt at 270° C. and had melted at 280° C.

In Example 4, the visual observation indicated that the solder layer 13A melted first and then the solder layer 13B melted. The DSC measurement indicated that the solder layer 13A started to melt at 230° C., then the entire solder layer 13 including the solder protective layer 14 started to melt at around 270° C., and it was at 280° C. that the entire solder layer 13 had melted.

In Comparative Example 3, the DSC measurement indicated that the solder layer 13 itself started to melt at around 275° C., and the solder protective layer 14 started to melt at around 277° C. and completely melted at 285° C. that was higher than in Examples 3 and 4.

In Comparative Example 4, the visual observation indicated that the solder layer 13A consisting of Sn single solder first melted. The DSC measurement indicated that while the solder layer 13A consisting of Sn single solder started to melt at 242° C., the solder layer 13B consisting of Au single solder started to melt at 280° C. and completely melted at 315° C. that was higher than in Examples 3 and 4. Also, in Comparative Example 4 the DSC measurement indicated that the exothermic peak existed at about 280° C. and it was seen that a mechanism different from the melting phenomenon has occurred.

Next, an evaluation of bonding strengths of junctions in Examples 3 and 4 and Comparative Examples 3 and 4 will be mentioned.

To investigate its solder bonding strength, a solder layer 13 of a submount 10 was molten by a heater and then a semiconductor device 7 was soldered from above with the solder layer and the junction was then cooled to make a sample. Thereafter, a tape peeling test by an evaluating tape was conducted and a peeling state of the junction was observed. The tape peeling test followed a conventional technique of measuring the adhesion strength of a metal, using a tape of identical adhesive strength. Of electrodes of semiconductor devices 7, those peeled off by the tape peeling test were regarded as a bonding failure. And, a proportion in number of such failures was taken to indicate a state of junction. The semiconductor device 7 used was the light emitting diode. Samples mounted for each of Examples 3 and 4 and Comparative Examples 3 and 4 were 100 pieces in number.

Table 4 shows percentages of tape peeling-off in Examples 3 and 4 and Comparative Examples 3 and 4 when light emitting diodes 7 were soldered, wherein the soldering temperature was varied from 270 to 300° C. to join the semiconductor devices 7 and the tape tests were carried out.

TABLE 4

| | Tape Peeled-off Evaluation (Percentage, %) Bonding Temperature (° C.) | | | | | |
|---|---|---|---|---|---|---|
| | 270 | 275 | 280 | 285 | 290 | 295 |
| Ex. 3 | 8 | 5 | 3 | 0 | 0 | 0 |
| Ex. 4 | 15 | 7 | 3 | 0 | 0 | 0 |
| C. Ex. 3 | 60 | 20 | 15 | 4 | 0 | 0 |
| C. Ex. 4 | 80 | 82 | 70 | 32 | 15 | 7 |

In Example 3, the tape peeled-off percentages were 8%, 5% and 3% at 270° C., 275° C. and 280° C., respectively and the semiconductor device 7 did not come off when soldered at any temperature of 285° C. or more.

In Example 4, the tape peeled-off percentages were 15%, 7% and 3% at 270° C., 275° C. and 280° C., respectively and the semiconductor device 7 did not come off if soldered at any temperature of 285° C. or more.

In Comparative Example 3, the tape peeled-off percentages were 60%, 20%, 4% and 15% at 270° C., 275° C., 280° C. and 285° C. respectively and the semiconductor device 7 did not come off if soldered at any temperature of 290° C. or more.

On the other hand, in Comparative Example 4, the tape peeled-off percentages were 80% to 5% at 270° C. to 300% and semiconductor devices 7 came off even if soldered at 300° C.

Examples 3 and 4 and Comparative Examples 3 and 4 above indicate that the submount 10 can be equipped with a solder layer having two solder layers 13 together with a solder protective layer 14, which vary in melting temperature and start to melt at a low temperature of 230 to 240° C., to allow the two solder layers to proceed to be molten stepwise. This allows the solder layer 13 including the solder protective layer 14 to be completely molten at a temperature of 280° C., thereby soldering between the semiconductor device 7 and the solder layer 13 firmly.

Next, a structure of a submount according to a third form of implementation of the present invention will be mentioned.

Figure 8:
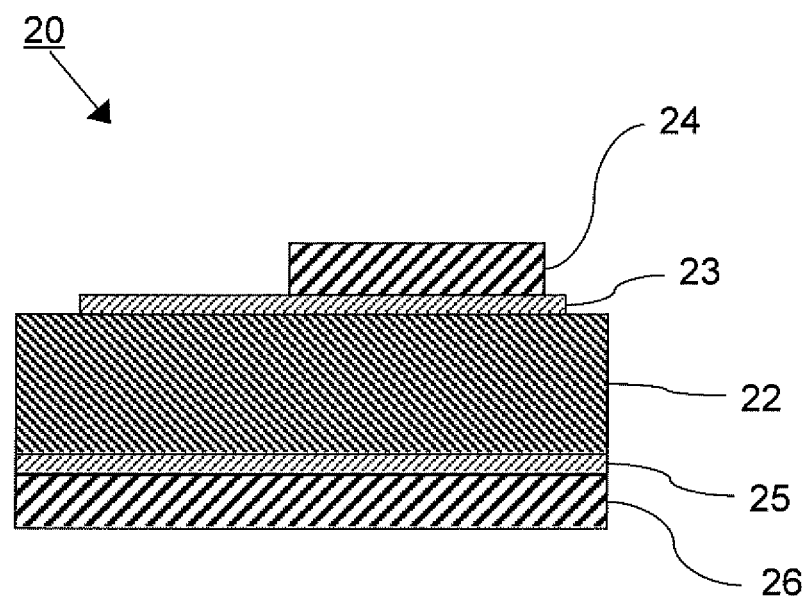
FIG. 8 is a cross sectional view diagrammatically illustrating a structure of a submount according to a third form of implementation of the present invention.

FIG. 8 is a cross sectional view which diagrammatically illustrates a structure of a submount according to the third form of implementation of the present invention. The submount 20 in this form of implementation comprises a submount substrate 22, an electrode layer 23 formed on top of the submount substrate 22 so as to cover a part or whole thereof and a solder layer 24 formed on a surface of the electrode layer 23. On the side of the submount 22 opposite to its top side for mounting a device, an electrode layer 25 and a solder layer 26 are formed so as to cover a part or whole of a rear surface of the submount substrate 22 to which a metal heat sink is attached. Here, on the top side of the submount substrate 22 the solder layer 24 is formed on the electrode layer 23 in a whole area thereof if the device is a light emitting diode etc. or alternatively in a patterned electrode area. Also, a gold or aluminum wire for connection to an external terminal may be connected to a portion of the electrode layer 23 to form an electrical circuit. The electrode layers 23 and 25 may be identical in material to each other. Also, the solder layers 24 and 26 may also be identical in material to each other. The solder layer 24 may preferably be made of an alloy of Sn with at least one of constituent metals selected from the group which consists of Au, Ag, Cu, Zn, In, Ga, Bi, Fe, Pb, Ti, Al, Sb and Ni but desirably is in particular a Pb free solder.

The solder layer 24 preferably has a composition of its constituent element which is deviated from a eutectic composition thereof. And, the solder layer 24 preferably has a range of melting temperature from its solidus temperature at which it starts to melt to its liquidus temperature at which it becomes completely liquid phase, namely a difference in temperature. The solder layer 24 is preferably adjusted in composition so that this range of melting temperature is more than 10° C. This range of melting temperature may be set so as to be the optimum conveniently by taking into account also the rate of temperature rise and heat-up time in heating reflow when a semiconductor device is soldered.

Properties in evaluating the molten state of a solder layer 24 according to a differential thermal method will be mentioned.

In this case, when the solder layer 24 is heated, a liquid phase sufficient for solder bonding can be obtained at a first peak of absorption differential thermal temperature. Further heating allows even more satisfactory a liquid phase to be obtained upon reaching a temperature indicating a peak of absorption differential thermal temperature on the higher temperature side. The solder layer 24 when heated should exhibit a differential thermal behavior having preferably a difference in temperature of more than 10° C. between a temperature at which it first exhibits a differential thermal fluctuation and a temperature at which it exhibits a termination of the differential thermal fluctuation, showing that it is fully molten. If this difference in temperature is less than 10° C., it is not desirable because the solder layer 24 then would not have enough range of melting temperature. The differential thermal behavior, which the solder layer when heated exhibits, may have two or more differential thermal peaks between the temperature at which it first exhibits the differential thermal fluctuation and the temperature at which it exhibits termination of the differential thermal fluctuation, showing that it is fully molten.

The electrode layer is desirably composed of a metal constituent element and preferably contains at least one element selected from the group which consists of Au, Pt, Ag, Cu, Fe, Al, Ti, W and Ni. The submount substrate 22 can be composed of any one of AlN, SiC and Si. Also, the submount substrate 22 may have a side face thereof formed with an electrode layer 23, too, in a manner as mentioned above and may then have its top and bottom connected together electrically.

Figure 9:
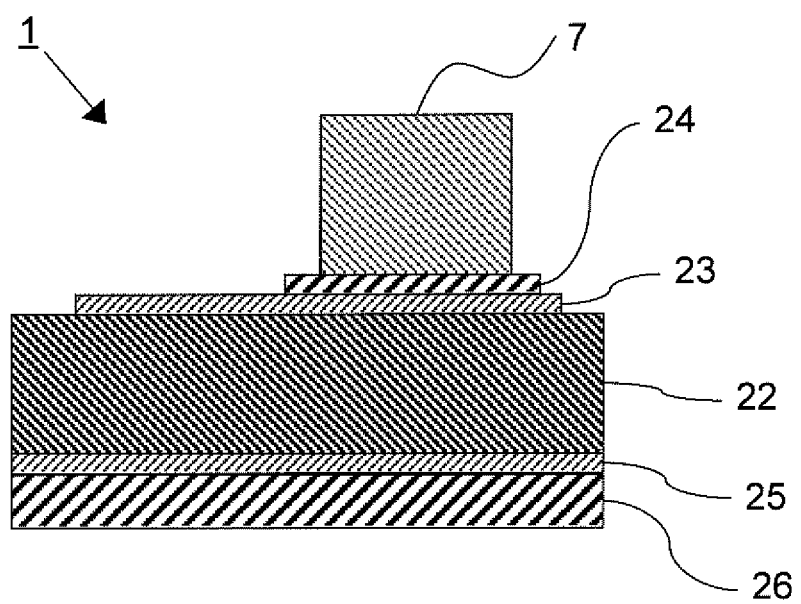
FIG. 9 is a view of cross section in part diagrammatically illustrating a dicing step in a process of manufacturing a submount as shown in FIG. 8.

Next, mounting a semiconductor device 7 on the submount according to the third form of implementation above with reference to the cross sectional view of FIG. 9 will be mentioned. In the submount 20 of the present invention as shown in FIG. 9, the semiconductor device 7 is soldered with the solder layer 24. The semiconductor device 7 may include light emitting devices such as a laser diode or a light emitting diode, a diode, an active element such as transistor or thyristor for use in high frequency amplification or switching and an integrated circuit.

The submount 20 features that in the submount for soldering with a semiconductor device 7 such as a light emitting device, the solder layer is formed in the state that it is alloyed of a composition deviated from a eutectic composition of its constituent elements, thereby expanding its range of melting temperature. Thus, by making the solder layer 24 deviated in composition from the eutectic composition, the range of melting temperature of the solder layer 24, which in the eutectic composition is limited to the eutectic temperature, can be widened to extend from its melting start temperature exhibited by the solidus temperature where the composition is not eutectic to its melting terminating temperature exhibited by the liquidus temperature. From this, it is inferred that the solder layer 24 will take its liquid phase containing state at a temperature above the melting start temperature. In soldering with a semiconductor device 7, the interdiffusion will bring about between the solder layer 24 and the electrode of the semiconductor device 7, thereby soldering easily.

A method of manufacturing a submount of the third form of implementation mentioned above will be mentioned below.

First, a submount substrate 22 is prepared and both surfaces are ground with a lapping machine and finished using a polishing machine. The finished submount substrate 22 is washed to make its surfaces clean. Then, to form an electrode layer 23 in a selected circuit pattern on a surface of the submount substrate 22 for mounting a device, patterning is performed for the surface. For patterning, photolithography is used to form a resist film on a portion of the surface of the submount substrate 22 other than a region where the electrode layer 23 is to be formed.

Next, a metal layer becoming the electrode layer 23 is deposited by vacuum evaporation method. The electron beam vapor deposition, resistance heating, sputtering or the like may be used. Subsequently, the electrode layer 23 is formed on top of the submount substrate 22 by the lift-off process. Specifically, the resist film formed in the patterning step is removed using a resist stripping solution, together with a portion of the metal film which has been deposited on the resist film, utilizing swelling of the resist film. This permits the electrode layer 23 of the selected pattern to be formed on the submount substrate 22. The resist stripping solution used may be acetone, isopropyl alcohol or any other resist stripper. Then, upon cleaning the surface of the electrode layer 23, patterning is performed in order to form a solder layer 24 of a selected pattern. For patterning, photolithography can be used. Here, the electrode layer 23 may be cleaned using wet cleaning or alternatively dry cleaning such as plasma or ozonolysis under UV irradiation.

Next, the electrode layer 24 is formed by deposition. To this end, the evaporation method using multiple independent evaporation sources, in which sources are elements constituting an alloy of solder, is conveniently used to form the electrode layer 24. For example, if the solder layer 24 is made of a binary alloy such as Au—Sn, it can then be formed by an electron beam evaporation method using two evaporation sources. For depositing the source materials, resistance heating vapor deposition may be used. Other than the vapor deposition, sputtering or plating may be used. Here, the composition of the solder layer 24 may be designed from the respective rates of evaporation and rates of vapor deposition of source materials so that a desired composition of the film is obtained, and the source materials may then be deposited so that the composition of the solder layer 24 becomes even over its depth by controlling these rate of evaporation. Also, the in-plane composition of the solder layer 24 is desirably made uniform by optimizing the shape of a substrate retaining dome in the evaporator and the mechanism of evaporation of the source materials.

Lift-off process is performed on the solder layer 24 and a pattern of the solder layer 24 is formed on the electrode layer 23. Specifically, a resist film formed in the patterning and a portion of the solder layer 24 which has been deposited on the resist film are together removed using a resist stripping solution and utilizing swelling of the resist film. This permits the solder layer 24 of a selected pattern to be formed on the electrode layer 23. The resist stripping solution used may be acetone, isopropyl alcohol or any other resist stripper.

Figure 10:
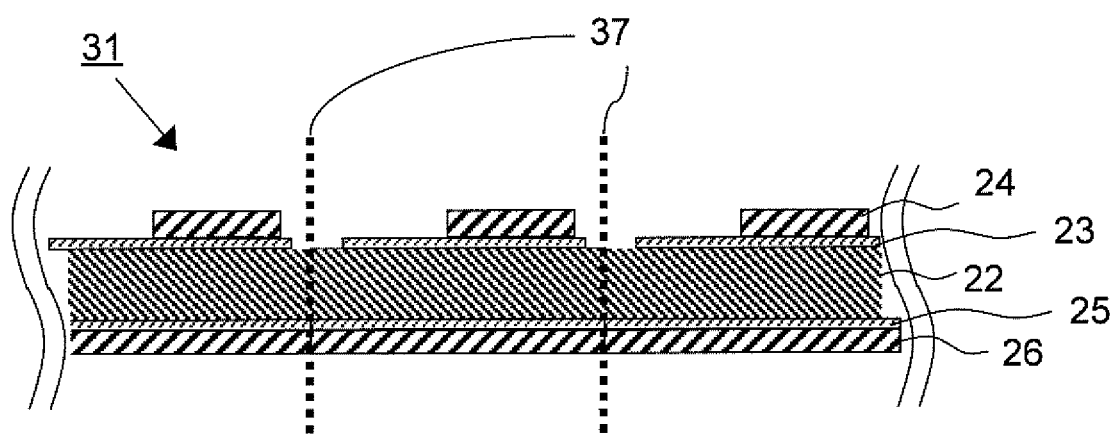
FIG. 10 is a view of cross section in part diagrammatically illustrating a dicing step prior to splitting in a process of manufacturing a submount as shown in FIG. 8.

The electrode layer (25) and the solder layer (26) are formed on the backside of the submount substrate 22, too. Finally, the submount substrate 22 is diced into submounts of a desired size. FIG. 10 is a view of cross section in part diagrammatically illustrating a dicing step prior to splitting in the submount manufacturing method of the present invention. As shown in FIG. 10, the submount substrate 31, that was made by the above method and is prior to splitting, can be separated by dicing using diamond disk along dicing lines indicating as the doted lines 37. By this separating, the submounts 20 having a desired size are obtained. For dicing, a scribing or fusion by a laser may be used.

According to the method of manufacturing a submount 20 in accordance with the third form of implementation, it is possible to manufacture submounts 20 excellent in soldering property to the semiconductor devices 7 with a high yield.

Example 5

Further details of the third form of implementation with reference to Example 5 will be mentioned below. At first, the manufacturing method of submount of Example 5 will be explained.

Both surfaces of sintered aluminum nitride substrate 22 having a high thermal conductivity (170 to 230 W/mK) were ground with a lapping machine and finished with a polishing machine to have an average surface roughness (Ra) of 0.2 µm or less on these surfaces. The finished aluminum nitride substrate 22 was wet-washed to clean its surfaces. And, the surface of the submount substrate 22 for mounting a device was covered by photolithography in an area thereof with a resist film, the area being the area on which an electrode layer 23 was not to be formed with. Then, a pattern of the electrode layer 23 was formed so that a submount 1 would have a size of 1 mm×2 mm square.

Next, an Au layer was deposited by the vacuum evaporator to a thickness of 0.2 to 0.4 µm and lift-off process was performed using acetone as a stripping solution to form the electrode layer 23. A solder layer 24 was formed using photolithography and vacuum vapor deposition as the same manner as for the electrode layer 23. First, the solder layer 24 was formed on the electrode layer 23 formed on the surface of the Au aluminum nitride substrate 22 by using the electron beam evaporator having vaporizing sources of Au and Sn. The composition of the solder layer 24 was adjusted so that the composition of the solder layer 24 deposited was Au:Sn=20:80 (in atomic ratio) and was deviated from the eutectic composition ratio of Au—Sn. This is also aimed at making the melting point of the solder layer 24 in this composition defined from its liquidus temperature identical to the melting point of Au:Sn=70:30 (in atomic ratio) as the eutectic composition of Au—Sn for comparison with Comparative Example to be described later.

Next, a lift-off process was performed using acetone as the resist stripping solution to form a pattern of the solder layer 24. Finally, the aluminum nitride substrate 22 obtained was cut using the dicing apparatus into submounts 20 of 1 mm×2 mm square in the Example.

Mention was next made of a Comparative Example.

Comparative Example 5

A submount was made in the same manner as in Example 5 except that the composition of the solder layer 24 was adjusted so as to be Au:Sn=30:70 (in atomic ratio) as the eutectic composition.

Properties of the submounts obtained in Example 5 and Comparative Example 5 will be mentioned.

First, melting temperature ranges of the solder layers 24 formed in the submounts 1 in Example 5 and Comparative Example 5 were measured. In the measurement, the solder layer 24 was heated and the melting temperature range of the solder layer 24 was measured by visual observation of its molten state using a high temperature microscope and by differential scanning calorimetry (DSC). Specifically, the DSC measures a temperature at which a phase transformation occurs at heating, namely a differential thermal peak, regarding a difference from a first peak corresponding to the solidus curve to a peak corresponding to the liquidus curve as a melting temperature range.

Figure 11:
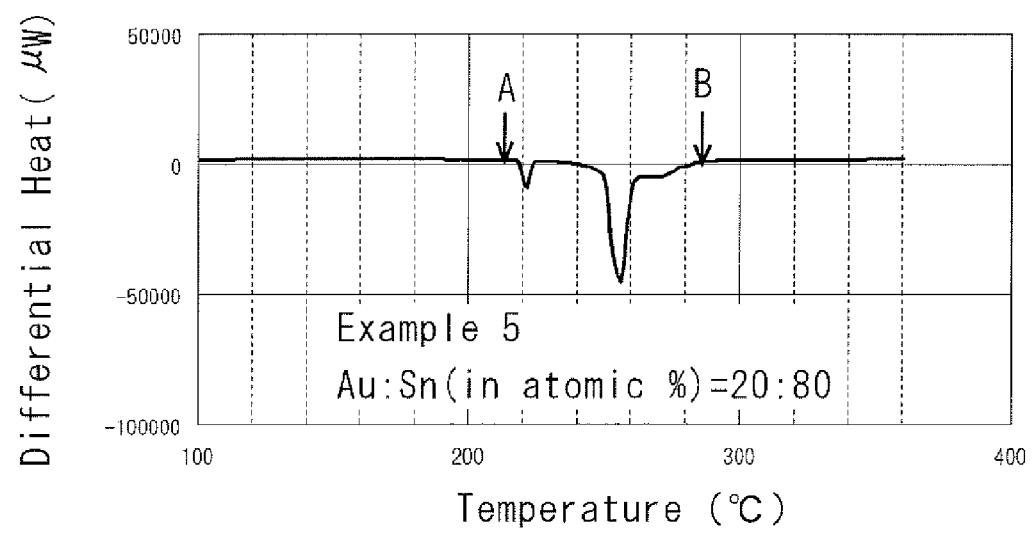
FIG. 11 is a graph illustrating results of DSC measurement in Example 5.

FIG. 11 is a graph illustrating results of DSC measurement in Example 5 in which the abscissa axis represents temperature (° C.) and the ordinate axis represents differential heat (µW) and the − side represents an endothermic reaction. As is apparent from FIG. 11, it is seen that in Example 5, the solder layer 24 starts to melt at 219° C. (see the arrow A in FIG. 11) and its completely melting temperature of is 285° C. (see the arrow B in FIG. 11).

Figure 12:
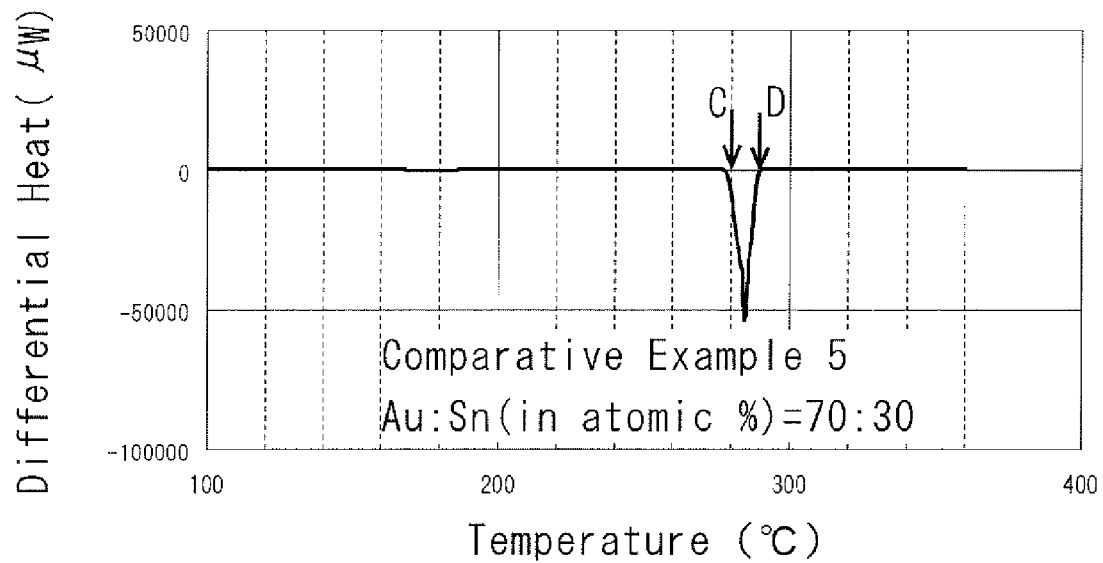
FIG. 12 is a graph illustrating results of DSC measurement in Comparative Example 5.

FIG. 12 is a graph illustrating results of DSC measurement in Comparative Example 5. The abscissa and ordinate axes in the graph are identical to those in FIG. 11. As is apparent from FIG. 12, it is seen that the eutectic composition Au—Sn of Comparative Example 5 has its melting start temperature and complete melting temperature are 277° C. and 287° C., respectively, with its melting temperature range being 10° C. (see the arrows C and D in FIG. 12).

Table 5 shows results of measurement of the melting temperatures in Example 5 and Comparative Example 5.

TABLE 5

|  | Solder Layer Composition (Atomic %) | Melting Temp. (DSC & Visual Observation) | | | Tape Peel-off Percentage (%) | | | | |
| --- | --- | --- | --- | --- | --- | --- | --- | --- | --- |
|  |  | Melt Start Temp. (° C.) | Complete Melt Temp. (° C.) | Temp. range (° C.) | Bonding Temperature (° C.) | | | | |
|  |  |  |  |  | 240 | 255 | 265 | 280 | 290 |
| Ex. 5 | Au:Sn = 20:80 | 219 | 285 | 66 | 99 | 38 | 0 | 0 | 0 |
| C. Ex. 5 | Au:Sn = 70:30 | 277 | 287 | 10 | 100 | 100 | 100 | 15 | 0 |

As is apparent from Table 5, the solder layer 24 in Example 5 has a melting temperature range of 66° C. while the solder layer in Comparative Example 5 is of eutectic composition having a melting temperature range of 10° C. It is thus seen that the solder layer 24 in Example 5 has a melting start temperature of 219° C. that is lower than that in Comparative Example 5 by 58° C. and its melting temperature range to the complete melting temperature is as wide as 66° C.

Soldering property of the submounts in Example 5 and Comparative Example 5 with a semiconductor device will be explained. To investigate its solder bonding strength, a solder layer 24 of a submount 20 was molten by a heater and a semiconductor device 7 was soldered from above with the solder layer and the junction was then cooled to make a sample. Thereafter, a tape peeling test by an evaluating tape was conducted and a peeling state of the junction was observed. The tape peeling test was conducted in the same manner as in Example 3. The semiconductor devices 7 used was the light emitting diode with electrodes of 300 μm square. Samples mounted for each of the Example and the Comparative Example were 100 pieces in number.

In Example 5 as shown in Table 5, it is seen that when the bonding temperature was varied from 240° C. to 255° C., the tape peeled-off percentage varied from 99% to 38% and in a temperature range of 265° C. to 290° C., the soldering was shown complete.

On the other hand, in Comparative Example 5 it is seen that with 240° C. to 265° C., the tape peeled-off percentage was 100%, indicating that the soldering failed. Being 15% with 285° C., the tape peeled-off percentage became 0% with 290° C. It is shown in Comparative Example 5 that the soldering fails unless the temperature is elevated to 290° C.

Figure 13:
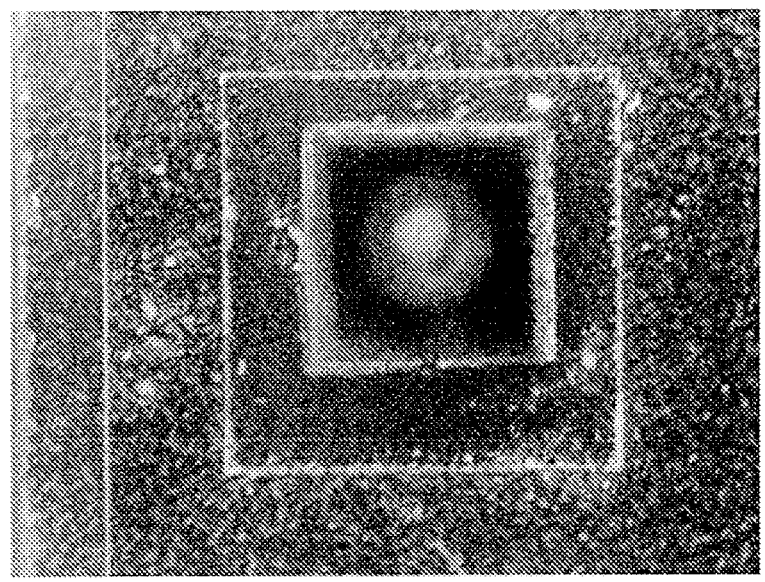
FIG. 13 shows at (A) an optical microscopic image taken in observation from top of a submount after a tape peeling test in Example 5 and at (B) an explanatory view thereof.
Figure 13:
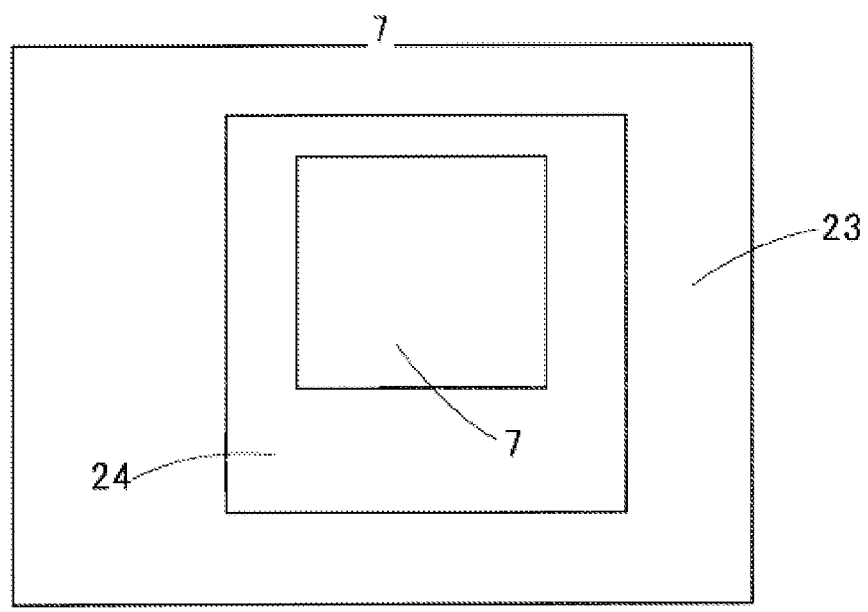

FIG. 13 shows at (A) an optical microscopic image taken in observation from top of a submount after a tape peeling test in Example 5 and at (B) an explanatory view thereof. The magnification is 181. As is apparent from FIG. 13, it is shown the light emitting diode 7 soldered with the solder layer 24 formed on the electrode layer 23 of Au remains unpeeled.

Figure 14:
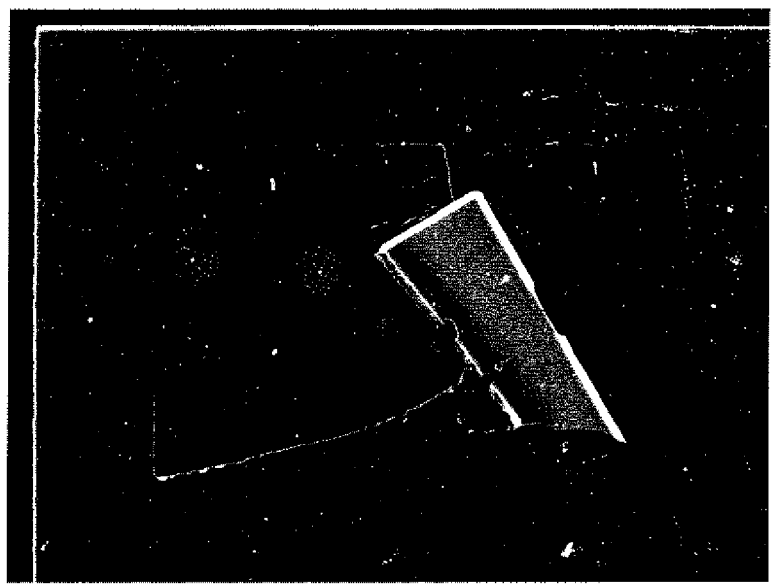
FIG. 14 shows at (A) an optical microscopic image taken in observation from top of a submount having a light emitting diode peeled off in the tape peeling test in Comparative Example 5 and at (b) an explanatory view thereof.
Figure 14:
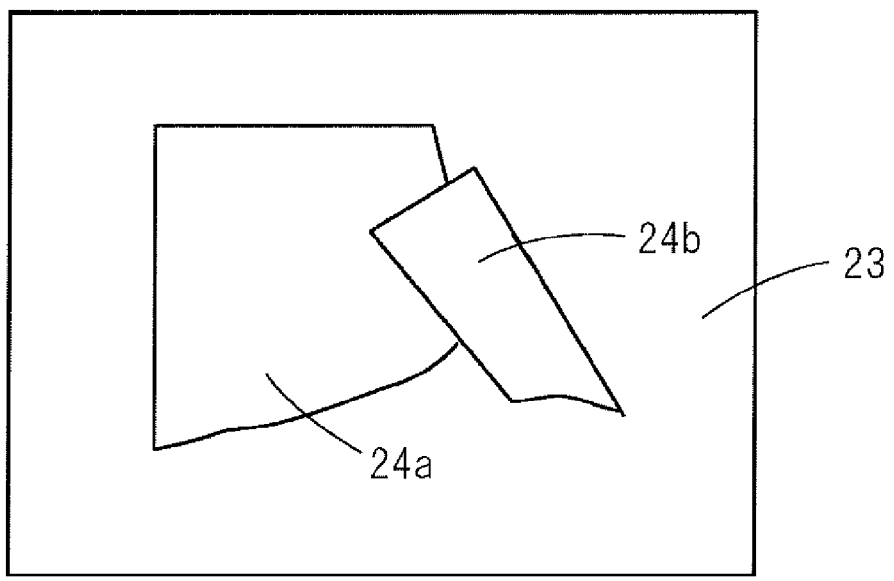

FIG. 14 shows at (A) an optical microscopic image taken in observation from top of a submount having a light emitting diode peeled off in the tape peeling test in Comparative Example 5 and at (b) an explanatory view thereof. The magnification is 181. From FIG. 14, a region 4a where a portion of the solder layer 24 formed on the electrode layer 23 was peeled off and the peeled-off solder layer portion 24b are observed. And it is seen that this peeling-off occurred at an interface between the electrode layer 23 and the solder layer 24 with the result that the light emitting diode 7 was peeled off.

From Example 5 and Comparative Example 5, it turns out that for soldering with a semiconductor element 7, the solder layer 24 having a composition deviated from eutectic composition forms a solder junction that cannot be come off by tape peeling when it was soldered at a temperature in a range between 265° C. and 290° C. as shown in Example 5. On the contrary, as shown in Comparative Example, the solder layer 24 having eutectic composition can only be soldered if it is soldered at a temperature of 290° C. In case as shown in Example 5, the solder layer 24 and the semiconductor device 7 can be soldered together at a soldering temperature that is in an extended range and at lower temperature.

Figure 15:
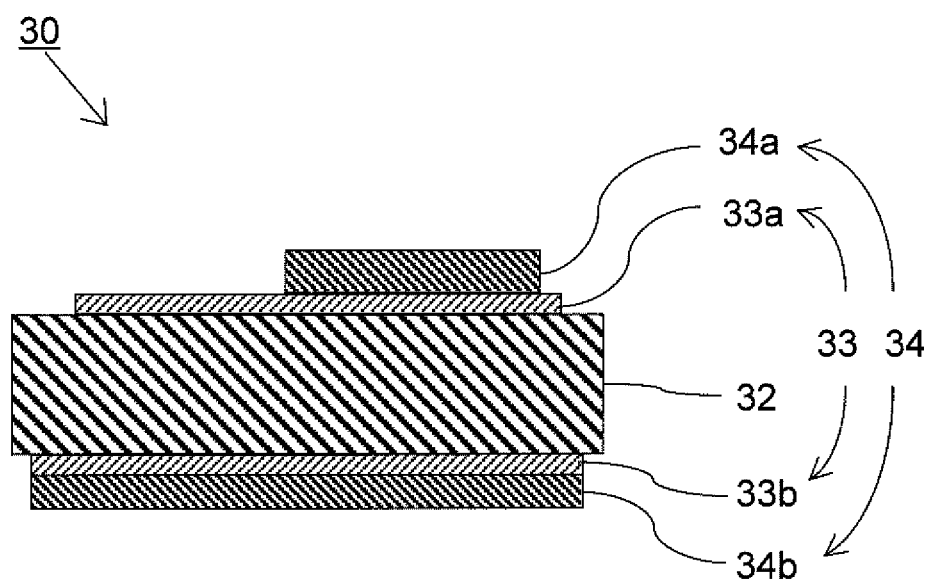
FIG. 15 is a cross sectional view diagrammatically illustrating a structure of a submount according to a fourth form of implementation of the present invention.

Next, a submount 30 according to a fourth form of implementation of the invention will be mentioned with reference to FIG. 15 shown in cross section.

In the submount 30 of the forth form of implementation as shown in FIG. 5, a submount substrate 32 has on one or each of its both sides an electrode layer 33 formed to cover a part or whole thereof, and a solder layer 34 is formed in an selected surface area on the electrode layer 33. The solder layer 34 is formed on the electrode layer 33 in a whole area thereof if the device is a light emitting diode or alternatively in a patterned electrode area. Also, a gold wire may be connected to a portion of the electrode layer 33 to form an electrical circuit. The submount substrate 32 may be composed of high thermal conductivity material such as aluminum nitride (AlN), silicon carbide (SiC), diamond IIa or the like. Also, the submount substrate 32 may have a side face thereof formed with an electrode layer, too, as above and may then have its top and bottom connected together electrically. The electrode layer 33 is desirably metallic and may be composed of any one of gold, platinum, silver, copper, iron, aluminum, titanium and tungsten. The solder layer 34 is desirably of a Pb free solder not containing lead. Furthermore, the solder may preferably contain two or more of elements of the group which consists of silver, gold, copper, zinc, indium, gallium, bismuth, aluminum and tin.

The features of the submount 30 of the fourth form of implementation is to improve the adherence between a submount substrate 32 and an electrode layer 33 by reducing the concentration of carbon in an interface and in a region adjacent to an interface between the submount substrate 32 and the electrode layer 33 so as not to exceed a certain amount. By way, the term "region adjacent to an interface" may be used herein to mean including both an interface and a region adjacent to the interface. By reducing the concentration of carbon in the region adjacent to an interface between the electrode layer 33 and a solder layer 34, the adherence therebetween may also be improved.

Here, the concentration of carbon for each region adjacent to an interface between the submount substrate 32 and the electrode layer 33 and between the electrode layer 33 and the solder layer 34 is reduced not to exceed an amount of $1 \times 10^{20}$ atoms/cm$^3$. If this value is exceeded, it is then not desirable because the adherences at regions adjacent to interfaces of the submount substrate 32, the electrode layer 33 and the solder layer 34 tend to deteriorate. It is thereby made possible to firmly bond the submount substrate 32 and the electrode layer 33 together or, as well be described, the submount 30 and a semiconductor device 7 together.

Figure 16:
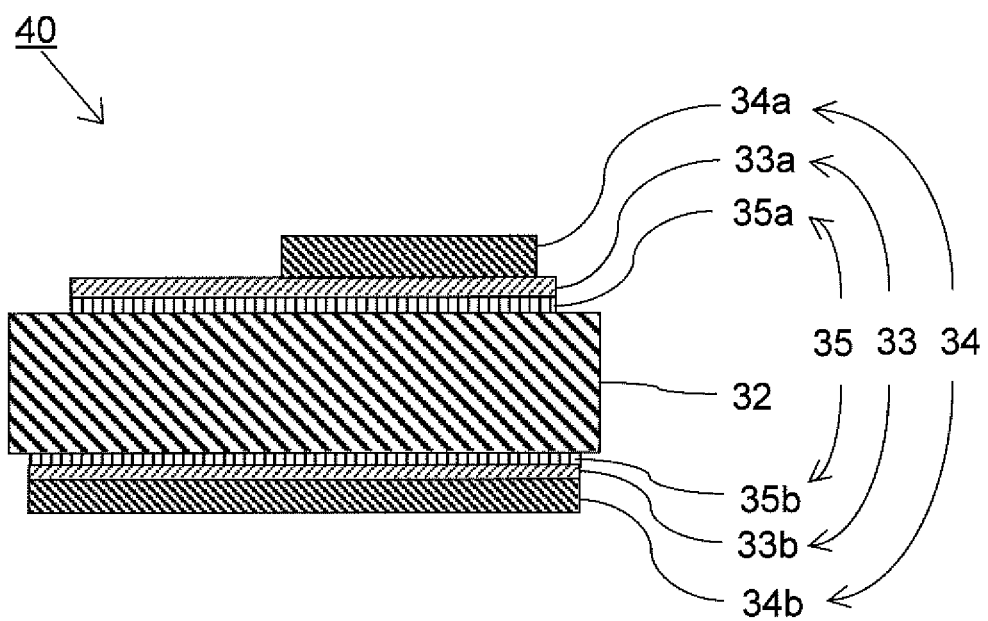
FIG. 16 is a cross sectional view diagrammatically illustrating a modified structure of a submount according to the fourth form of implementation

FIG. 16 is a cross sectional view diagrammatically illustrating a structure of a submount 40 that is different from and a modification of that shown in FIG. 15. The submount 40 differs from the submount 30 in FIG. 15 in that a substrate protective layer 35 is formed between the submount substrate 32 and the electrode layer 33 so as to cover a part of whole of the submount substrate 32. The substrate protective layer 35 is covered first in the manufacturing process of the submount 30. It is a protective layer to protect the submount substrate 32 by preventing a surface thereof from being corroded by etching or the like in the steps of forming the electrode layer 33 and the solder layer 34 as formed on the substrate protective layer 35. The substrate protective layer 35 is desirably composed of a metal which can prevent corrosion of the submount substrate 32 and is different from a metal constituting the electrode layer 33 and may contain any one of titanium, platinum, nickel, tungsten, molybdenum, silver, copper, iron, aluminum and gold.

In the submount 40 shown in FIG. 16, it is possible to improve the adherence between the submount substrate 32 and the substrate protective layer 35 by reducing the concentration of carbon in a region adjacent to an interface between the submount substrate 32 and the substrate protective layer 35 so as to be less than $1 \times 10^{20}$ atoms/cm$^3$. Further, by reducing the concentration of carbon in a region adjacent to an interface between the electrode layer 33 and the solder layer 34 and the substrate protective layer 35 so as to be less than $1 \times 10^{20}$ atoms/cm$^3$, it is possible to improve the adherence in such a region.

Figure 17:
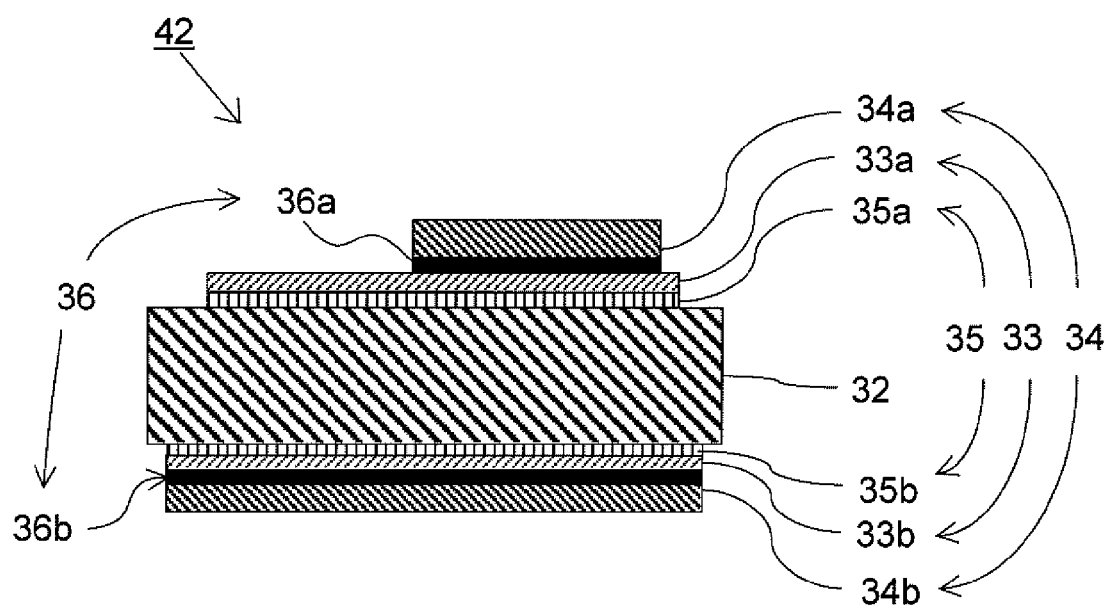
FIG. 17 is a cross sectional view diagrammatically illustrating another modified structure of a submount according to the fourth form of implementation.

As in a submount shown in FIG. 17 as a modification of these, an adherent layer 36 may further be disposed between the electrode layer 33 and the solder layer 34 to enhance the adhesion each between the electrode layer 33 and the adherent layer 36 and between the adherent layer 36 and the solder layer 34. The adherent layer 36 may be composed of a metal as same as the substrate protective layer and advantageously of titanium.

Figure 18:
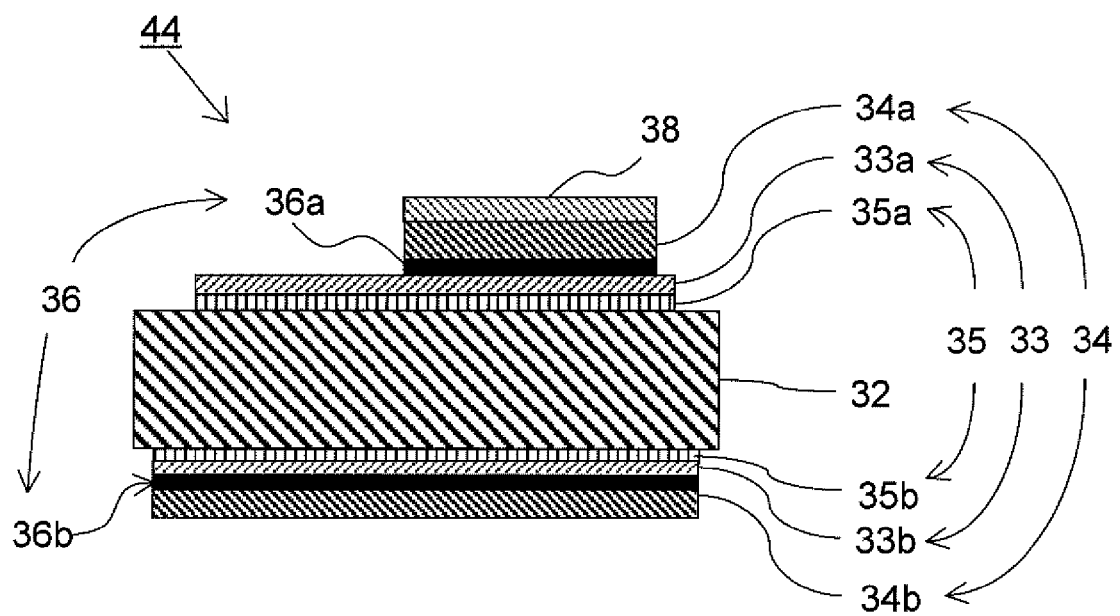
FIG. 18 is a cross sectional view diagrammatically illustrating a further modified structure of a submount according to the fourth form of implementation.

As in a submount shown in FIG. 18 as a modification of the above, a solder protective layer 37 may be further formed on the solder layer 34 to prevent oxidation of the solder layer.

Figure 19:
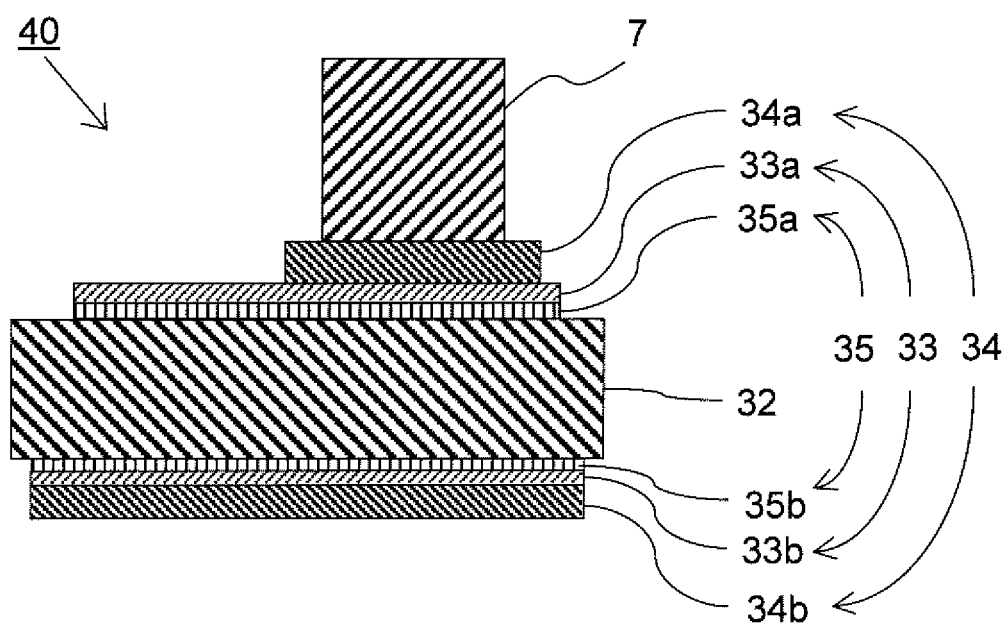
FIG. 19 is a cross sectional view diagrammatically illustrating a structure of the submount of FIG. 16 having a semiconductor device mounted thereon.

Next, the mounting a semiconductor device on the submount of the fourth form of implementation will be mentioned with reference to FIG. 19. While in the Figure, the submount 40 is shown having the semiconductor device mounted thereon, the submount 30, 42, 44 may likewise have.

In the submount 40 shown in FIG. 19, the semiconductor device 7 is soldered therewith the solder layer 34a The semiconductor device may be a light emitting device such as laser or light emitting diode, a diode, an active element such as transistor or thyristor for used in high frequency amplification or switching and an integrated circuit.

The features of submount 30, 40, 42, 44 of the fourth form of implementation are that the adherences at each region can be raised and the soldering property between the submount 30 and the semiconductor device 7 can be improved by reducing the concentration of carbon at each of the region adjacent to an interface between the submount substrate 32 and the electrode layer 33, the region adjacent to an interface between the submount substrate 32 and the substrate protective layer 35 and further the region adjacent to in interface between the electrode layer 33 and the solder layer 34 so as not to exceed a certain amount as mentioned above. Further, since the so-called adherent layer which has so far been required need not be used, the total number of process steps and the total amount of materials used for manufacturing the submount 30, 44, 44 can be reduced. As a result, the submount can be furnished at reduced cost.

Next, a method of manufacturing a submount of the fourth form of implementation above will be mentioned. The manufacturing method of the submount 40 as shown in FIG. 16 will be described below.

First, a submount substrate 32 is prepared and both faces of this were ground by a lapping machine and finished using a polishing machine or the like to have an average surface roughness of less than 0.1 μm, preferably less than 0.05 μm.

The submount substrate 32 is then subjected to surface cleaning. This surface cleaning is preferably performed by ultraviolet ozonizing or oxygen etc. plasma ashing process to remove carbon compounds adhered on the surface of the submount substrate 32 and to reduce carbon concentration so as not to exceed a selected value.

A substrate protective layer 35a is formed onto whole cleaned surface of the submount substrate 32. This substrate protective layer 35a is formed by vapor deposition using a vacuum evaporator or a sputtering apparatus. Surface cleaning improves the adherence between the submount substrate 32 and the substrate protective layer 35a.

Next, patterning is performed by photolithography. Specifically, a resist is coated uniformly over a whole surface of the submount substrate 32 using a spinner and thereafter is baked in a baking furnace and then subjected to γ-ray contact exposure using a mask aligner. After exposure, a portion of the resist where an electrode layer 33a is to be formed is dissolved using a tetramethylamine family developer to expose the substrate protective layer 35a.

And, a metal becoming an electrode layer 33a is deposited by vapor deposition in the vacuum evaporator and the entire resist is dissolved using acetone to remove a portion of the metal other than the electrode layer 33a by lift-off process and thereby to form the electrode layer 33a. Prior to forming the electrode layer 33a, the surface of the substrate protective layer 35a is preferably cleaned to remove carbon compounds adhered thereon and to reduce carbon concentration there so as not to exceed the selected value. This surface cleaning may be effected by ultraviolet ozonizing and oxygen plasma ashing process and can raise the adherence between the substrate protective layer 35a and the electrode layer 33a.

A solder layer is formed on a portion of the electrode layer 33a by photolithography and lift-off process using a vacuum vapor deposition process as the same manner in the formation of the electrode layer 33a mentioned above. Then, prior to vacuum vapor deposition of the solder layer, the exposed surfaces of the electrode layer 33a is desirably cleaned to remove carbon compounds adhered on those exposed electrode surfaces and to reduce carbon concentration on the surfaces so as not to exceed the selected value. The adherence between the electrode layer 33a and the solder layer 34 can thereby be improved. And, those portions of the substrate protective layer 35a that remain exposed on surfaces of the submount substrate 32 are removed to expose those surfaces of the submount substrate 32. Finally, the submount substrate 32 thus obtained is split into submounts 30 of a desired size by using a dicing apparatus or the like.

Thus, in this form of implementation of the invention, each of exposed surface areas of the submount substrate 32, the substrate protective layer 35a and the electrode layer 33a before they are formed with the substrate protective layer 35a, the electrode layer 33a and the solder layer 34a thereon, respectively, can be treated by ultraviolet ozonizing or oxygen plasma ashing process to remove carbon compounds adhered on each surface area and to reduce carbon concentration there so as not to exceed the selected value, thereby improving the adherence between them. Moreover, if an adherent layer is formed between the electrode layer 33a and the solder layer 34a, the surface of the electrode 33a prior to forming the solder layer 34a may be cleaned to reduce carbon concentration not to exceed the selected value. Furthermore, if a solder protective layer 37 is formed on the solder layer 34a, the surface of the solder layer 34a may be cleaned to reduce carbon concentration not to exceed the selected value.

While the method of manufacturing the submount 40 as a modification of the forth form of implementation has been described, it can be seen that the other submounts 30, 42 and 44 can likewise be manufactured. For example, if an adherent layer 36 is inserted in the submount 44, the surface of the electrode layer 33a prior to forming the adherent layer 36 may be treated to reduce carbon concentration. Also, if a solder protective layer 37 is inserted in the submount 30, 40, 42, 44, the surface of the solder layer 34 prior to forming the solder protective layer 37 may be treated to reduce carbon concentration.

Example 6

First, a manufacturing a submount 30 of Example 6 will be mentioned.

Both surfaces of a sintered aluminum nitride substrate 32 of 55 mm square and 0.3 mm thick having a high thermal conductivity (230 W/mK) were ground with a lapping machine and finished with a polishing machine.

Next, to perform patterning by photolithography, a resist was coated uniformly over a whole surface of the substrate using a spinner and thereafter was baked as desired in a baking furnace and then subjected to γ-ray contact exposure using a mask aligner. A mask for the exposure was designed so that 2,500 pieces of submount each of 1 mm square submount size could be patterned at the same time. After the exposure, a portion of the resist where an electrode layer 33a was to be formed was dissolved using a tetramethylamine family developer to expose the submount substrate 32. The carbon removal for the exposed surface of the submount substrate 32 was treated by oxygen plasma ashing process (pressure: 1 Pa, high frequency power: 300 W and treatment time: 2 minutes). And gold is deposited onto the treated surface by using a vacuum evaporator.

Next, the entire resist was dissolved using acetone to remove a portion of Au other than the electrode layer 33a by lift-off process and thereby to form the predetermined electrode layer 33a. The electrode layer 33a had a thickness of 0.1 μm and a size of 800 μm square on each surface.

Then, after the surface portion of the electrode layer 33a which was formed on the surface of the aluminum nitride substrate 32 was cleaned by the oxygen plasma ashing process (pressure: 1 Pa, high frequency power: 300 W and treatment time: 2 minutes) to reduce carbon concentration thereof, a solder layer 34a of 3.3 μm was formed onto the electrode layer 33a by using photolithography and the vacuum evaporator as the same manner of forming the electrode layer 33a. The solder layer 34a had constituents of Ag and Sn and a size of 400 μm square on the side for bonding to a semiconductor device and 800 μm square on the substrate bonding side. Finally, the aluminum nitride substrate 32 obtained was cut using a dicing machine into submounts of a 1 mm square submount size. A submount 30 of Example 6 was thus made.

Example 7

A submount in Example 7 was made in the same manner as in Example 1 except that for each of the substrate and the electrode layer, the surface was cleaned by the ultraviolet ozonizing process (atmospheric pressure, 240 W, 30 minutes).

Example 8

A submount in Example 8 was made in the same manner as in Example 1 except that the electrode layer 33a was formed to a thickness of 2 μm.

Next, Comparative Example 6 will be mentioned.

Comparative Example 6

A submount of Comparative Example 6 was made in the same manner as in Example 1 except that the surface in Example 6 was not cleaned by plasma ashing but by conventional washing.

Table 6 shows thicknesses of the electrode layers, carbon concentrations in regions adjacent to the interfaces and others in Examples 6 to 8 and Comparative Example 6.

TABLE 6

| | Thickness | | | | | |
|---|---|---|---|---|---|---|
| | Substrate (mm) | Electrode Layer (μm) | Solder Layer (μm) | Surface Cleaning by | Carbon Conc. (×atoms/cm$^3$) | Tape Peel-Off (%) |
| Ex. 6 | 0.3 | 0.1 | 5 | Oxygen Plasma | $10 \times 10^{20}$ | 0 |
| Ex. 7 | 0.3 | 0.1 | 5 | UV Ozone | $9 \times 10^{19}$ | 0 |
| Ex. 8 | 0.3 | 2 | 5 | Oxygen Plasma | $3.2 \times 10^{19}$ | 0 |
| C. Ex. 6 | 0.3 | 0.1 | 5 | None | $3 \times 10^{20}$ | 0 |

Next, properties of the submounts obtained in Examples 6 to 8 and Comparative Example 6 will be mentioned.

First, the carbon concentration in each sample prior to forming the solder layer 34a on the electrode layer 33a was measured in ESCA (Electron Spectrometry for Chemical Analysis) in the process of manufacturing the submount in Example 6, 7, and Comparative Example. The carbon concentration ratio was calculated by normalizing carbon peak intensity with gold peak intensity for the electrode layer 33a as a ground layer.

Figure 20:
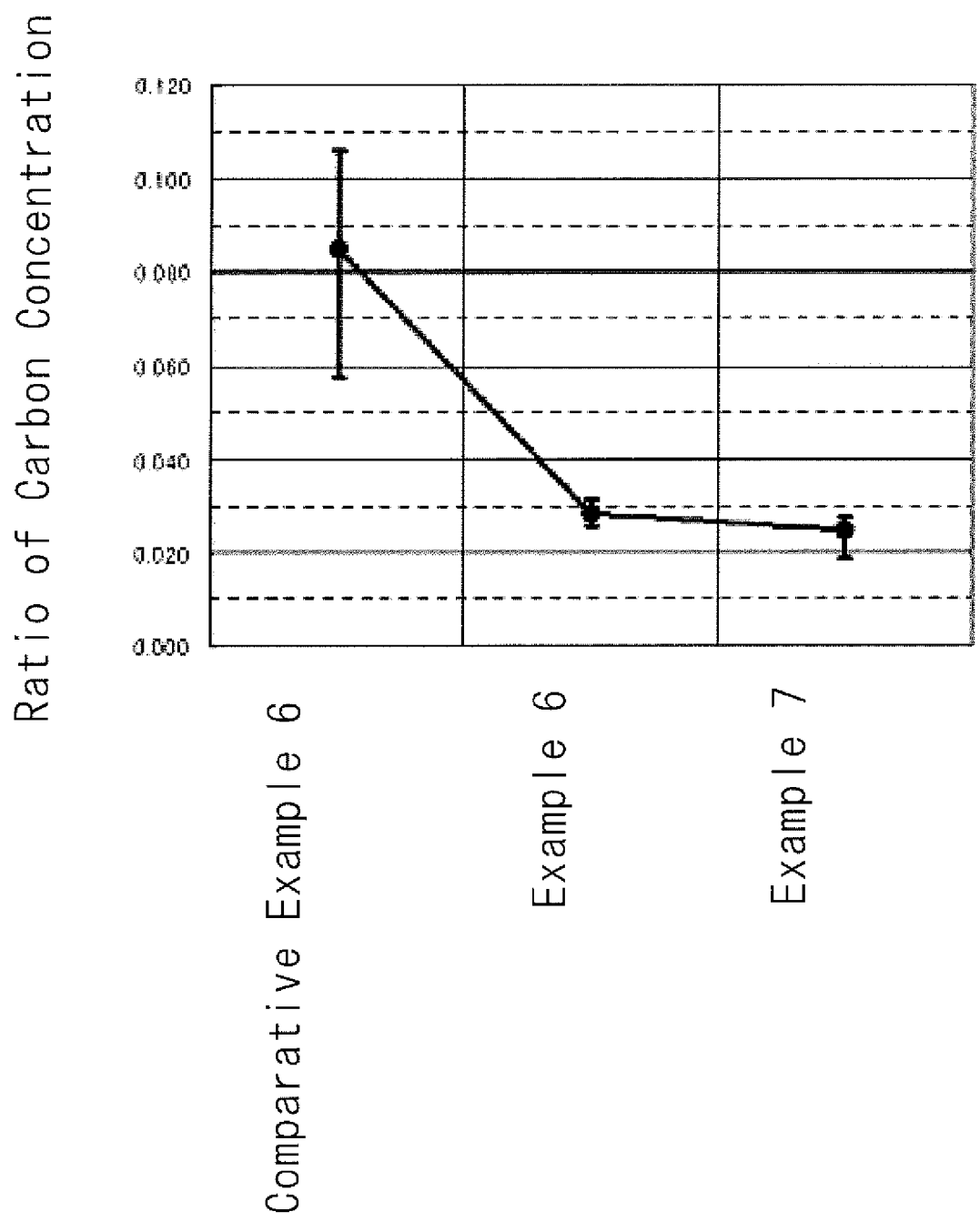
FIG. 20 is a graph illustrating results of ESCA measurement of ratios of carbon concentration in a surface region of electrode layer prior to forming a solder layer thereon in Examples 6 and 7 and Comparative Example 6.

FIG. 20 is a graph illustrating results of ESCA measurement of ratios of carbon concentration in a surface region of electrode layer prior to forming a solder layer thereon in Examples 6 and 7 and Comparative Example 6. The ratio of carbon concentration plotted along the ordinate axis in the graph was calculated by normalizing the carbon peak intensity with the gold peak intensity for the electrode layer 33a as the ground layer in each of Examples 6 and 7 and Comparative Example 6. As is apparent from FIG. 20, the ratio of carbon concentration at the surface of the electrode layer 33a was about 0.028 in Example 6 in which the oxygen plasma treatment was performed and about 0.025 in Example 7 in which the ultraviolet ozonizing treatment was performed. On the other hand, the ratio of carbon concentration at the surface of the electrode layer 33a in Comparative Example 6 in which no such surface cleaning treatment was carried out was about 0.085 that amounted to about three times as large as those in Examples 6 and 7.

Next, carbon concentrations at depths of positions in the solder layer 34a in the submount made in each of Examples 6 to 8 and Comparative Example 6 were measured in SIMS (Secondary Ion Mass Spectroscopy). Since the thickness of the electrode layer 33a in each of Examples 6 and 7 was too thin as thin as 0.1 μm to precisely analyze at a region adjacent to the interface between the electrode layer 33a and the solder layer 34a, the electrode layer 33a of Example 8 was made thick enough to this end and then the SIMS measurement was carried out.

Figure 21:
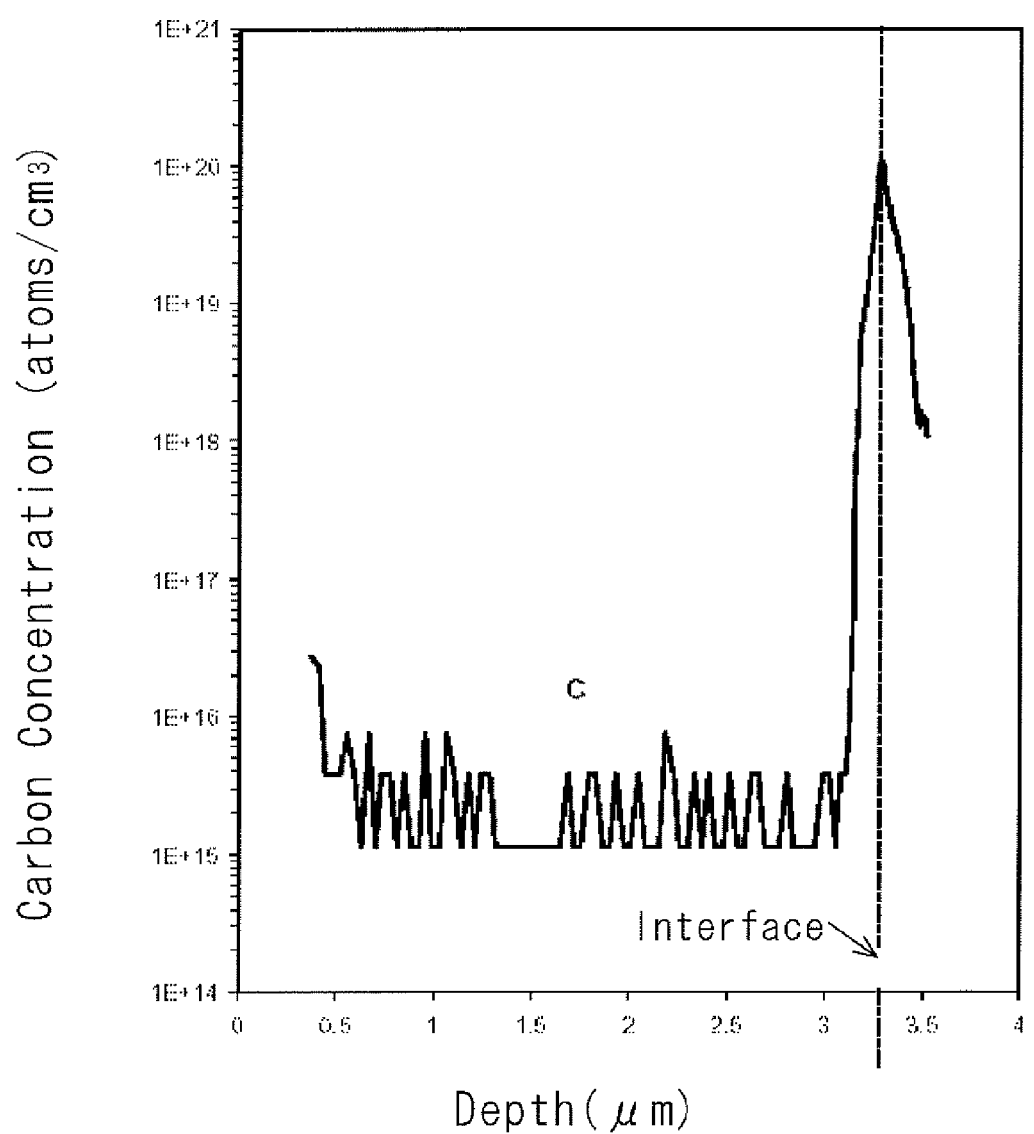
FIG. 21 is a graph illustrating results of SIMS measurement of carbon concentration distribution in a depth direction of a solder layer for samples in Example 6.

FIG. 21 is a graph illustrating results of SIMS measurement of carbon concentration distribution in a depth direction of the solder layer for samples in Example 6. The ordinate axis represents the carbon concentration (atoms/cm$^3$) and the abscissa axis represents the distance in the direction of depth (μm). In the graph, the dotted line indicates a region of the interface of which the left hand side is the solder layer 34*a* and the right hand side is the electrode layer 33*a*. As is apparent from FIG. 21, the carbon concentration was $1 \times 10^{20}$ atoms/cm$^3$ at a region of the interface between the electrode layer 33*a* and the solder layer 34*a* and $1 \times 10^{16}$ atoms/cm$^3$ or less in the solder layer 34*a*. Here, the lower limit of analysis is $5 \times 10^{15}$ atoms/cm$^3$.

Figure 22:
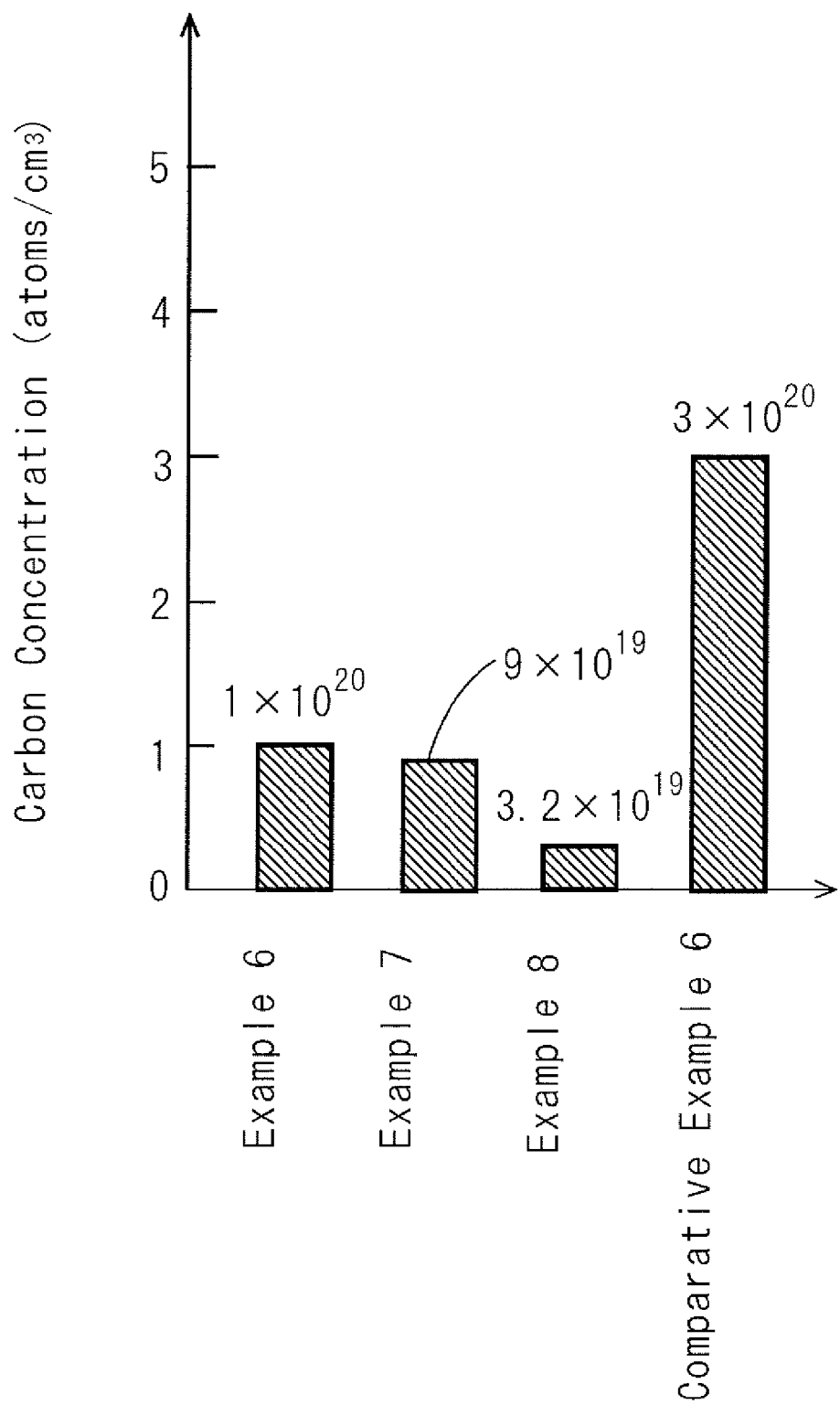
FIG. 22 is a graph illustrating results of SIMS measurement of carbon concentration in a region adjacent to an interface between an electrode layer and a solder layer in Examples 6-8 and Comparative Example.

FIG. 22 is a graph illustrating results of SIMS measurement of carbon concentration in a region adjacent to an interface between an electrode layer and a solder layer in Examples 6 to 8 and Comparative Example. The ordinate axis represents the carbon concentration (atoms/cm$^3$) in Example 6 to 8 and Comparative Example 6. As is apparent from FIG. 22, carbon concentrations in regions of interface in Examples 6, 7 and 8 and Comparative Example 6 are $1 \times 10^{20}$ atoms/cm$^3$, $9 \times 10^{19}$ atoms/cm$^3$, $3.2 \times 10^{19}$ atoms/cm$^3$ and $3 \times 10^{20}$ atoms/cm$^3$, respectively. It is seen that the carbon concentration at the region of interface can be reduced in Examples 6 to 8 to about ⅓ of that in Comparative Example 6.

Next, properties of the submount in each of Examples 6 to 8 and Comparative Example 6 will be mentioned. Each submount sample in Examples 6 to 8 and Comparative Example 6 was subjected to a tape peel-off test with an evaluating tape directly applied to the sample and its peel-off state was observed. The samples mounted in number for each of the Examples 6 to 8 and Comparative Example 6 was 100 pieces.

Figure 23:
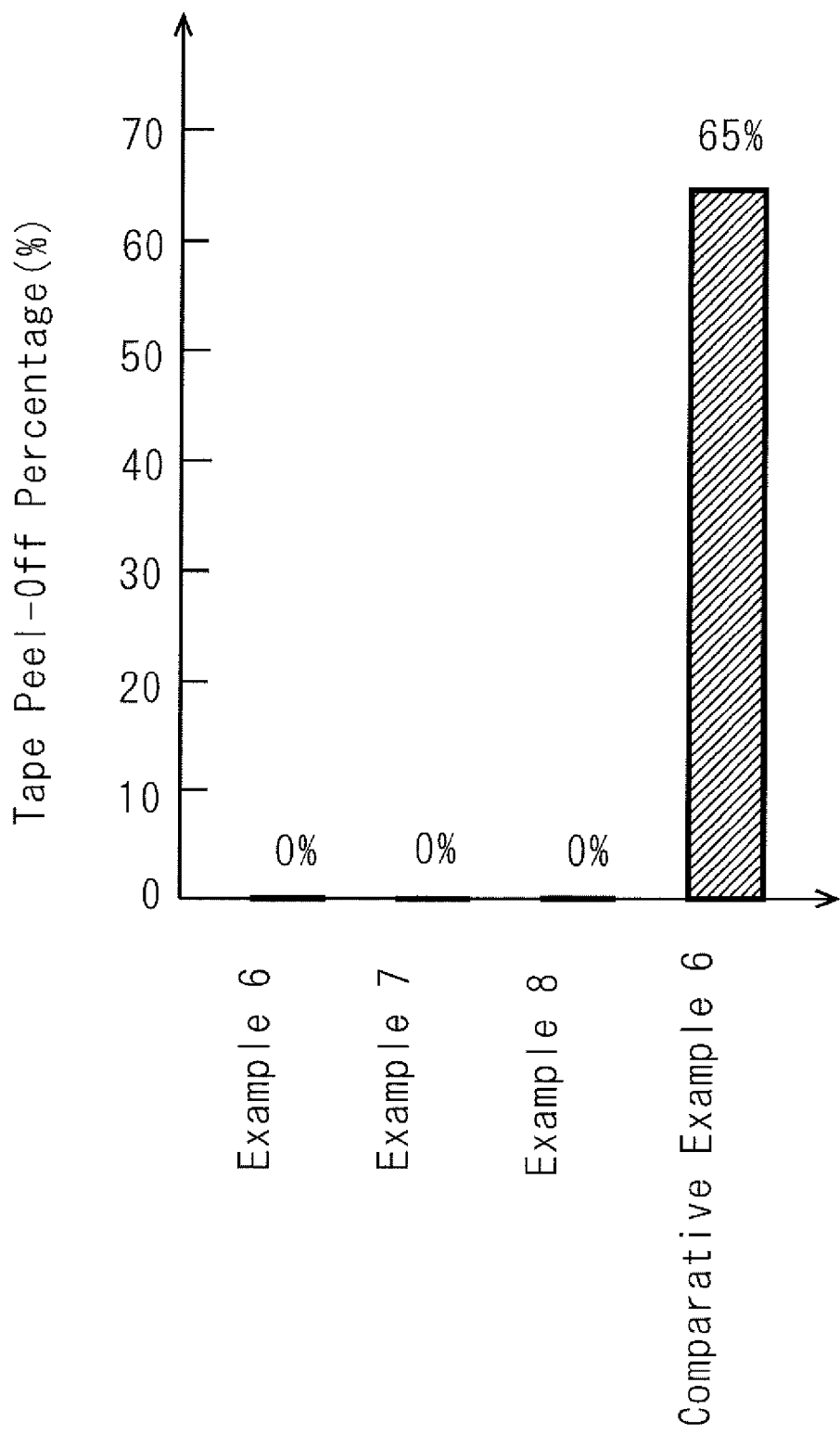
FIG. 23 is a graph illustrating percentages of tape peeling-off in Examples 6-8 and Comparative Example.

FIG. 23 is a graph illustrating percentages of tape peeling-off in Examples 6-8 and Comparative Example. In the graph, the ordinate axis represents the percentage (%) of tape peeling-off. It is apparent from the graph that in Examples 6-8, no peeling-off occurred for the solder layer 34*a*. However, in Comparative Example 6, percentage of tape peeling-off was 65%, showing that the solder layer 34*a* could easily be peeled off. And, in Comparative Example 6, the tape was peeled off at an interface between the electrode layer 33*a* and the solder layer 34*a*, indicating that the bonding force between the solder layer 34*a* and the electrode layer 33*a* was weak.

Figure 24:
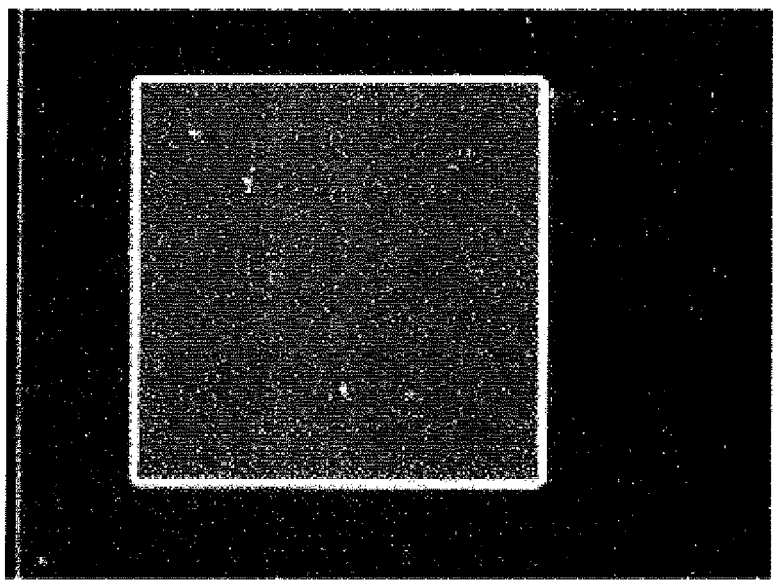
FIG. 24 shows at (A) an optical microscopic image taken in observation from top of a submount made in Example 6, after conducting a tape peeling test and at (B) an explanatory view thereof.
Figure 24:
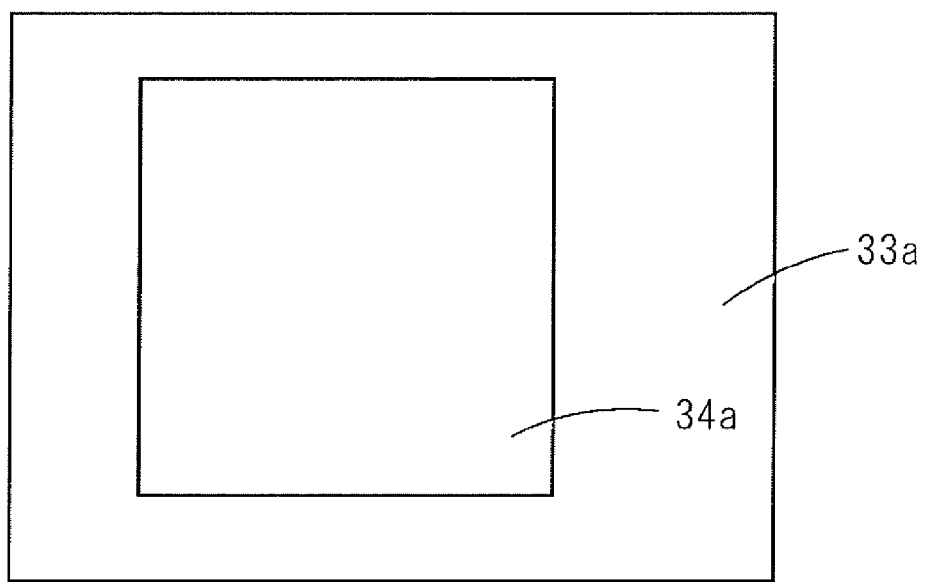

FIG. 24 shows at (A) an optical microscopic image taken in observation from top of the submount made in Example 6, after conducting a tape peeling test and at (B) an explanatory view thereof. The magnification is 181. As is apparent from FIG. 24, it is seen that the solder layer 34*a* patterned to be square is formed on the electrode layer 33*a* of gold and remains unpeeled.

Figure 25:
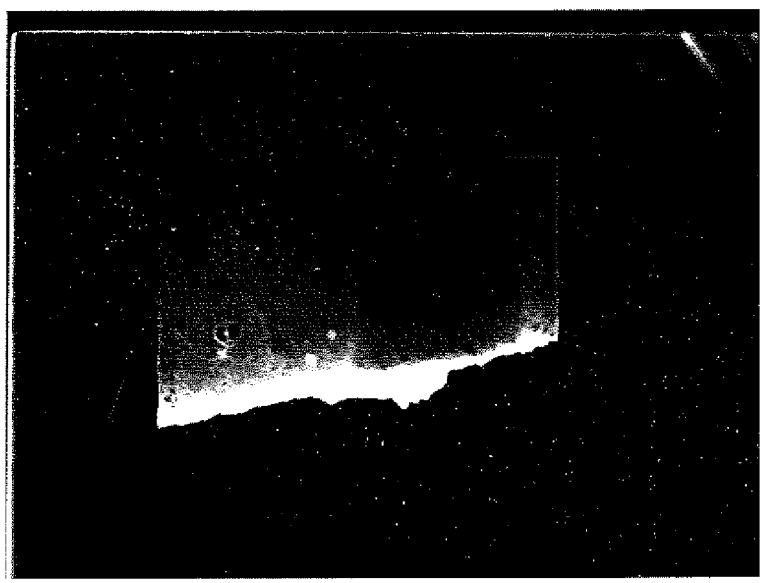
FIG. 25 shows at (A) an optical microscopic image taken in observation from top of a submount made in Comparative Example 6, after conducting a tape peeling test to have a solder layer a peeled off and at (B) an explanatory view thereof.
Figure 25:
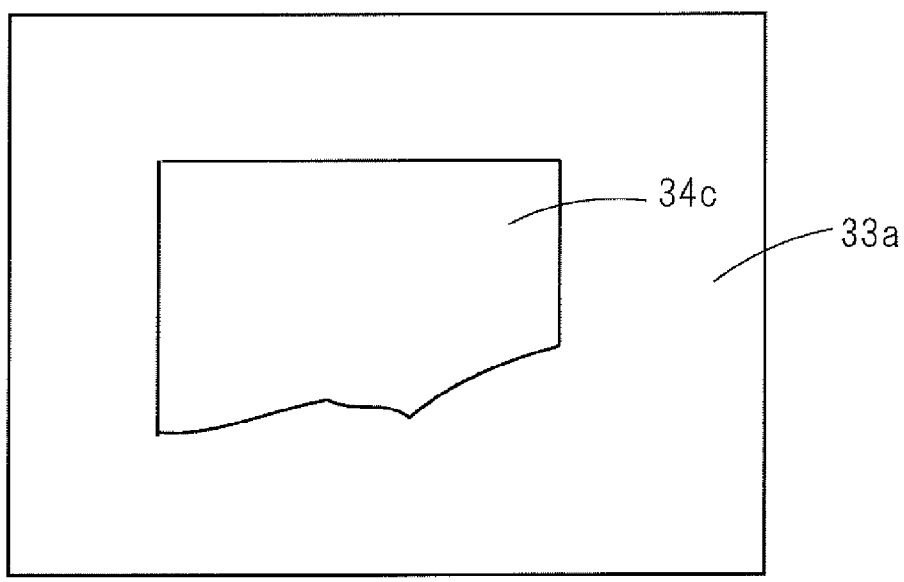

FIG. 25 shows at (A) an optical microscopic image taken in observation from top of the submount made in Comparative Example 6, after conducting a tape peeling test to have a solder layer a peeled off and at (B) an explanatory view thereof. The magnification is 181. From FIG. 25 it is seen that a portion of the solder layer 34*a* formed on the electrode layer 33*a* of gold was broken and peeled off, and only its unpeeled portion 34*c* is seen. And, it is seen that the breakage and peeling off occurred at an interface between the electrode layer 33*a* and the solder layer 34*a*.

Examples 6 and Comparative Example 6 above show that the peeling-off was occurred at an interface between the electrode layer 4*a* and the solder layer 5*a*.

Examples 6 to 8 and Comparative Example 6 above indicate that adjusting carbon concentration in a region adjacent to the interface between the electrode layer 33*a* and the solder layer 34*a* or the interface of the electrode layer 33*a* with the solder layer 34*a* allows adherence of the solder layer 34*a* to the electrode layer 33*a* to be improved.

Next, a structure of a submount according to a fifth form of implementation of the present invention will be mentioned.

Figure 26:
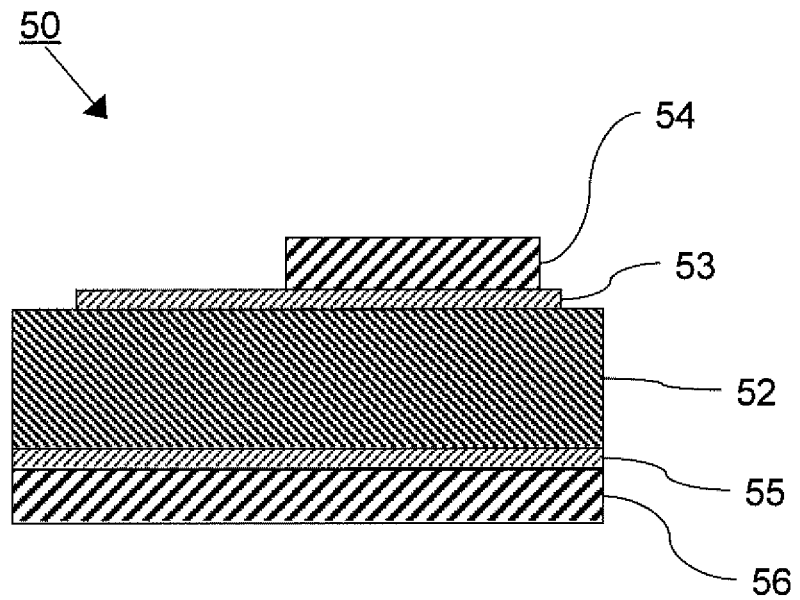
FIG. 26 is a cross sectional view diagrammatically illustrating a structure of a submount according to a fifth form of implementation of the present invention.

FIG. 26 is a cross sectional view diagrammatically illustrating the structure of a submount 50 according to the fifth form of implementation of the present invention. In the submount 50 of the this form of implementation as shown in FIG. 26, a submount substrate 52 has on its upper side an electrode layer 53 formed to cover a part or whole thereof, and a solder layer 54 is formed in an selected surface area on the electrode layer 53. On the other hand, on the side opposite to the upper side on which a semiconductor device is mounted, the submount 50 has an electrode layer 55 and a solder layer 56 formed so as to cover a part or whole of a rear surface of the submount substrate 52 to which a metal heat sink is attached.

Here, the solder layer 54 is formed on the electrode layer 53 in a whole area thereof if the device is such as a light emitting diode or alternatively in a patterned electrode area. Also, a gold or aluminum wire for connection to an external terminal may be connected to a portion of the electrode layer 53 to form an electrical circuit. The electrode layers 53 and 55 may be identical in material to each other. Also, the solder layers 54 and 56 may also be identical in material to each other.

The solder layer 54 is composed of constituent elements in a composition ratio that varies in a depth direction of the solder layer, i.e., varies as a function of depth of a position in the solder layer. In other words, the ratio of composition of elements constituting the solder layer in its depth direction, namely the composition ratio distribution (hereinafter, referred to conveniently as composition distribution) is here not even and made uneven.

Figure 27:
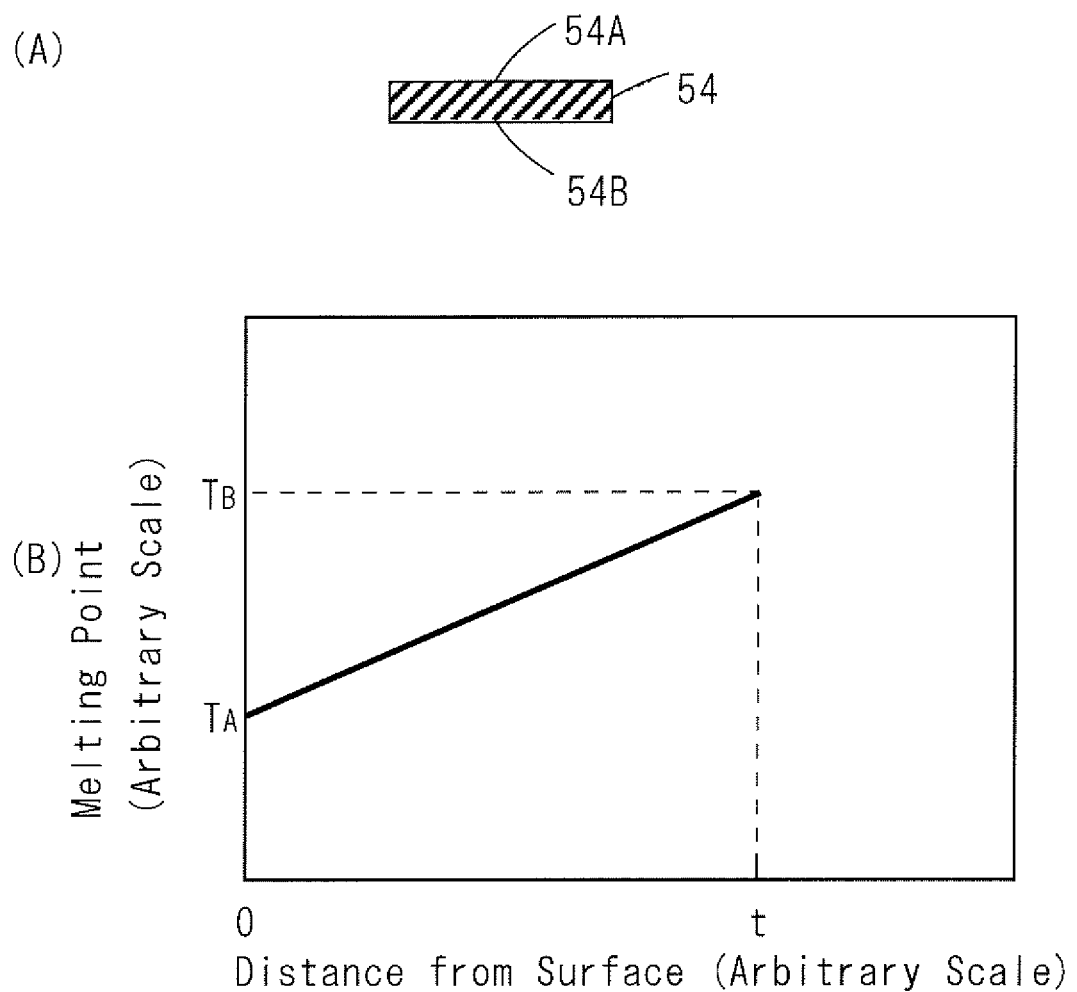
FIG. 27 shows a graph diagrammatically illustrating melting point distribution of a solder layer in FIG. 26.
Figure 28:
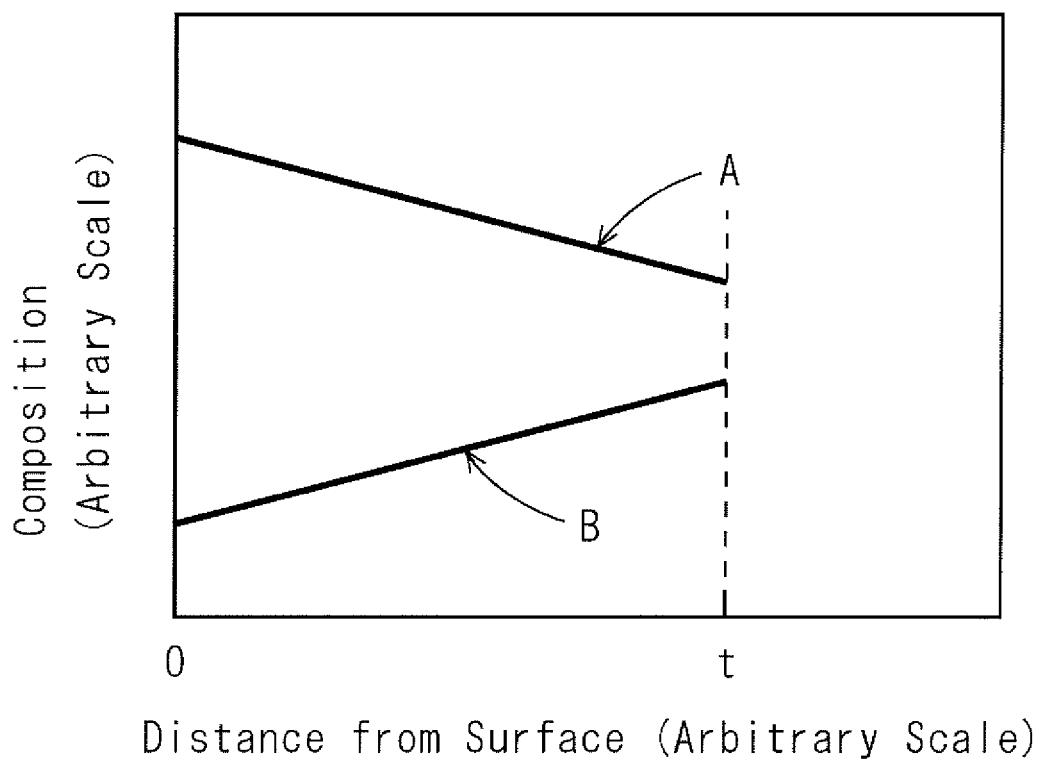
FIG. 28 is a graph diagrammatically illustrating composition distribution of the solder layer in FIG. 26.

FIGS. 27 and 28 are graphs diagrammatically illustrating melting point distribution and composition distribution of the solder layer in FIG. 26, respectively. In the graphs, the abscissa axes represent the distance in depth direction of the solder layer 54 from its surface as the origin (in arbitrary scale) and the ordinate axes represent the melting point and composition (in arbitrary scale) of the solder layer, respectively. One of the features of the present invention is that the melting point $T_A$ at the side of a solder layer 54 at which a semiconductor device is bonded thereto, namely at its front side 54A, is made lower than the melting point $T_B$ at the rear side 54B of the solder layer 54.

As shown in FIG. 28, if such a solder layer 54 is composed of metals A and B, the proportion of metal A in the composition is made higher at the front side and lower at the back side. Conversely, the proportion of metal B in the composition is made lower at the front side and higher at the rear side. While to form an uneven composition distribution, the each composition is shown varied linearly for the metals A and B, it may be varied along a curve or continuously stepwise, thereby forming an uneven composition distribution. This allows making the melting point the melting point $T_A$ at its front side 54A of the solder layer 54 lower than the melting point $T_B$ at its rear side. The solder layer 54 may be made of a solder composed of a plurality of constituent elements. The solder layer 54 may be composed of at least one constituent metal element selected from the group which consists of Au, Ag, Cu, Zn, In, Ga, Bi, Fe, Pb, Ti, Al, Sb and Ni but is preferably of a Pb free solder.

Next, an example of the composition of a solder layer 54 will be mentioned.

Figure 29:
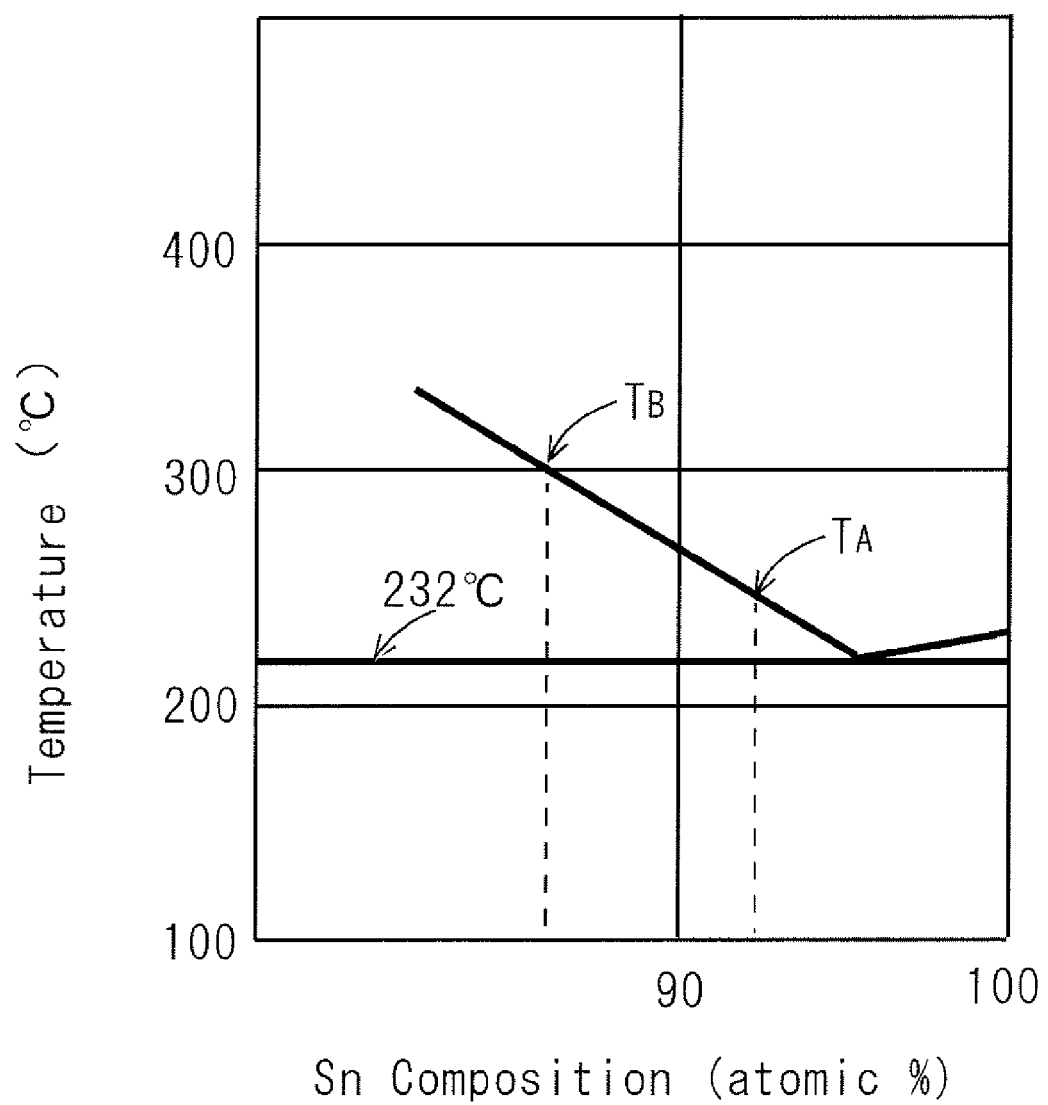
FIG. 29 shows a portion of the equilibrium diagram of a solder layer.

FIG. 29 shows a portion of the equilibrium diagram of a solder layer 54 that is the so-called phase diagram of the solder layer 54 made of an alloy Ag—Sn on the side that is rich in Sn. In the diagram, the abscissa axis represents the composition of Sn (in atomic %) and the ordinate axis represents the temperature (in ° C.). It is shown that if in the solder layer 54 the composition at its front side 54A (atomic ratio) is Ag:Sn=6:94, then the melting point $T_A$ there can be about 250° C. And, if the composition of the solder layer at its rear side is Ag:Sn=14:86, then the melting point $T_B$ there can be about 300° C. Thus, if the proportion of Sn in the composition is made higher at the front side 54A of the solder layer and made lower at its rear side 54B, it is then possible to make the melting point $T_A$ at the front side 54A of the solder layer 54 lower than the melting point $T_B$ at its back side 54B.

If the solder layer 54 is set in composition as mentioned above to form a vertically uneven composition distribution in the solder layer 54, a distribution in melting point can then be created in the solder layer, causing a range to be created between the temperature at which the solder layer 54 begins to melt and the temperature at which it fully melts. In this case, the difference in melting point between the front side 54A of the solder layer 54 and its rear side 54B is preferably more than 10° C. If this value is not exceeded, it is then undesirable because it is not possible to effectively prevent the solder layer 54 from scrambling as does occur in bonding to a semiconductor device as will be described below. It is thus made possible to expand the range in melting point of the solder layer 54 and to adjust the amount of liquid phase formed in the solder layer 54.

The electrode layer 53 is desirably made of one or more metals as its constituent elements and may preferably contain at least one of Au, Pt, Ag, Cu, Fe, Al, Ti, W and Ni. The submount substrate 52 may be made of any one of AlN, SiC and Si. Also, the submount substrate 52 may have a side face thereof formed with an electrode layer 53, too, as above and may then have its top and bottom connected together electrically.

Next, the mounting a semiconductor device on the submount of the fifth form of implementation above will be mentioned.

Figure 30:
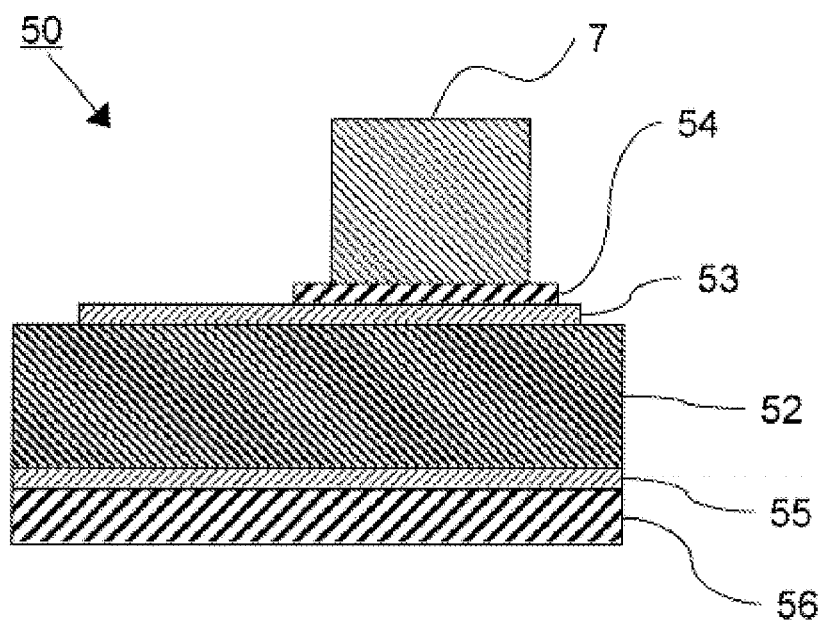
FIG. 30 is a cross sectional view diagrammatically illustrating a structure of the submount of FIG. 26 having a semiconductor device mounted thereon.

In the submount 50 shown in FIG. 30, the semiconductor device 7 is soldered with the solder layer 54. The semiconductor device may be a light emitting device such as laser or light emitting diode, a diode, an active element such as transistor or thyristor for used in high frequency amplification or switching and an integrated circuit.

One of the features of the fifth form of implementation is that in a submount 50 for soldering with a semiconductor device 7 such as a light emitting device, the solder layer 54 is provided with an uneven composition distribution so as to lower the melting point at its front side 54A than at its rear side and then to expand the range in melting temperature of the solder layer 54. Accordingly, in the process in which the solder layer 54 is bonded to the semiconductor device 7, the solder layer 54 first becomes liquid phase at its front side 54A so that its liquid phase first produced is reduced than if its composition is distributed evenly. The solder layer if brought to a temperature higher that the temperature at which it starts to melt at its front side is brought into the state that it contains the liquid phase at its front side and then can readily be bonded to the semiconductor device 7 presumably because of the interdiffusion of materials between the semiconductor device 7 and the electrode.

This allows the submount 50 of the present invention to reduce the amount of scrambling of solder on the semiconductor device 7. It is thus possible to effectively prevent short-circuit failure in a device such as a semiconductor laser diode and to make submounts with such devices with an increased yield.

A method of manufacturing a submount according to the fifth form of implementation above will be mentioned below.

First, a submount substrate 52 is prepared and its both sides are ground with a lapping machine and finished using a polishing machine. The finished submount substrate 52 is washed to make its surfaces clean. Then, to form an electrode layer 53 in a selected circuit pattern on a surface of the submount substrate 52 for mounting a device, patterning is performed for the surface. For patterning, photolithography is used to form a resist film on a portion of the surface of the submount substrate 52 other than a region where the electrode layer 53 is to be formed.

A metal layer becoming the electrode layer 53 is formed on a whole surface of the submount substrate 52 including the resist film by vacuum vapor deposition which may use electron beam vapor deposition, resistance heating, sputtering or the like. The electrode layer 53 is formed on top of the submount substrate 22 by the lift-off process. Specifically, the resist film formed in the patterning step is removed using a resist stripping solution, together with a portion of the metal film which has been deposited on the resist film, utilizing swelling of the resist film. This permits the electrode layer 53 of the selected pattern to be formed on the submount substrate 52. The resist stripping solution used may be acetone, isopropyl alcohol or any other resist stripper.

Then, upon cleaning the surface of the electrode layer 53, the patterning is performed in order to form a solder layer 54 of a selected pattern. For patterning, photolithography can be used. Here, the electrode layer 53 may be cleaned using wet cleaning or alternatively dry cleaning such as by plasma or by ozonolysis under UV irradiation.

Next, the electrode layer 54 is formed by deposition. To this end, a method is preferably used that source materials, in which elements constituting an alloy of the solder to be layered, are vaporized individually from independent vaporizing sources. For example, if the solder layer 54 is made of a binary alloy such as Ag—Sn, it can then be formed by an electron beam vapor evaporation method using two vaporizing sources. For depositing the source materials, resistance heating vapor deposition may be used. Other than the vapor deposition, sputtering or plating may be used. Here, the composition of the solder layer 54 may be designed from the respective rates of evaporation and rates of vapor deposition of source materials so that a desired composition distribution of the film is obtained, and the source materials may then be deposited so as to vary the composition of the solder layer 54 and to form an uneven composition distribution, over its depth by controlling these rate of evaporation. Also, the in-plane composition distribution of the solder layer 24 is desirably made uniform by optimizing the shape of a substrate retaining dome in the evaporator and the mechanism of evaporation of the source materials.

Next, lift-off process is performed on the solder layer 54 and a pattern of the solder layer 54 is formed on the electrode layer 53. Specifically, a resist film formed in the patterning and a portion of the solder layer 54 which has been deposited on the resist film are together removed using a resist stripping solution and utilizing swelling of the resist film. This permits the solder layer 54 of a selected pattern to be formed on the electrode layer 53. The resist stripping solution used may be acetone, isopropyl alcohol or any other resist stripper. The electrode layer 55 and the solder layer 56 are formed on the rear side of the submount substrate 52, too. Finally, the submount substrate 52 is split into submounts of a desired size.

Figure 31:
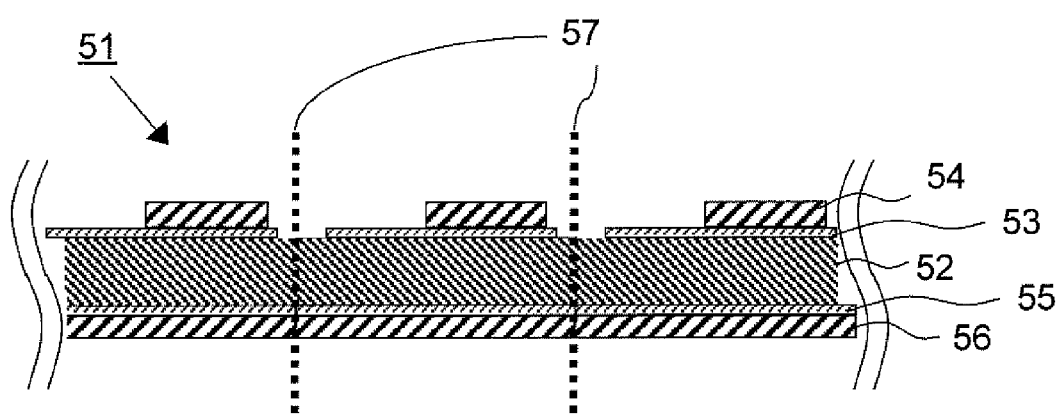
FIG. 31 is a view of cross section in part diagrammatically illustrating a dicing step in a process of manufacturing a submount as shown in FIG. 26.

FIG. 31 is a view of cross section in part diagrammatically illustrating a dicing step prior to splitting in the submount manufacturing method of the present invention. As shown in FIG. 31, a submount substrate 51 as made by the above method and prior to splitting can be split by dicing the same along dicing lines 57 into pieces for separation as submounts 50 of a desired size. For dicing, a scriber or fusion with a laser may be used. According to the method of manufacturing a submount 50 in accordance with the fifth form of implementation, it is possible to manufacture submounts 50 excellent in soldering property with semiconductor devices 7 with a high yield.

Example 9

Further details of the fifth form of implementation with reference to Example 9 will be mentioned below. First, a manufacturing method of a submount in Example 9 will be described.

Both surfaces of a sintered aluminum nitride substrate 52 having a high thermal conductivity (230 W/mK) were ground by a lapping machine and finished with a polishing machine to have an average surface roughness (Ra) of 0.2 μm or less on these faces. The finished aluminum nitride substrate 52 was wet-washed to clean its surfaces.

The surface of the submount substrate 52 for mounting a device was covered by photolithography in an area thereof with a resist film, the area being the area on which an electrode layer 53 was not to be formed with. Then, a pattern of the electrode layer 53 was formed so that a submount 50 would have a size of 1 mm×2 mm square. Next, an Au layer was deposited by the vacuum evaporator to a thickness of 0.2 to 0.4 μm and lift-off process was performed to form the electrode layer 53 by using acetone as a stripping solution.

A solder layer 54 was formed using photolithography and vacuum vapor deposition as for the electrode layer 53. First, the solder layer 54 was formed on the electrode layer 53 formed on the surface of the aluminum nitride substrate 52 by using the electron beam evaporator equipped with Ag and Sn vaporizing sources. The solder layer was formed to have a gradient composition over its depth so that the components were proportioned at Ag:Sn=6:94 (in atomic ratio) on its front side 54A and at Ag:Sn=14:86 (in atomic ratio) on its back side 54B and to have a thickness of 10 μm.

Next, the lift-off process was performed using acetone as the resist stripper to form a pattern of the solder layer 54. Finally, the aluminum nitride substrate 52 obtained was cut using the dicing apparatus into submounts 50 of 1 mm×2 mm square in Example 9.

Mention is made of comparative Examples

Comparative Example 7

A submount was made in the same manner as in Example 9 except that the solder layer 54 had a uniform composition distribution over its depth with a composition of Ag:Sn (in atomic ratio)=6:94.

Comparative Example 8

A submount was made in the same manner as in Example 9 except that the solder layer 54 had a uniform composition distribution over its depth with a composition of Ag:Sn (in atomic ratio)=14:86.

Next, properties of submounts obtained in Example 9 and Comparative Examples 7 and 8 will be mentioned.

Figure 32:
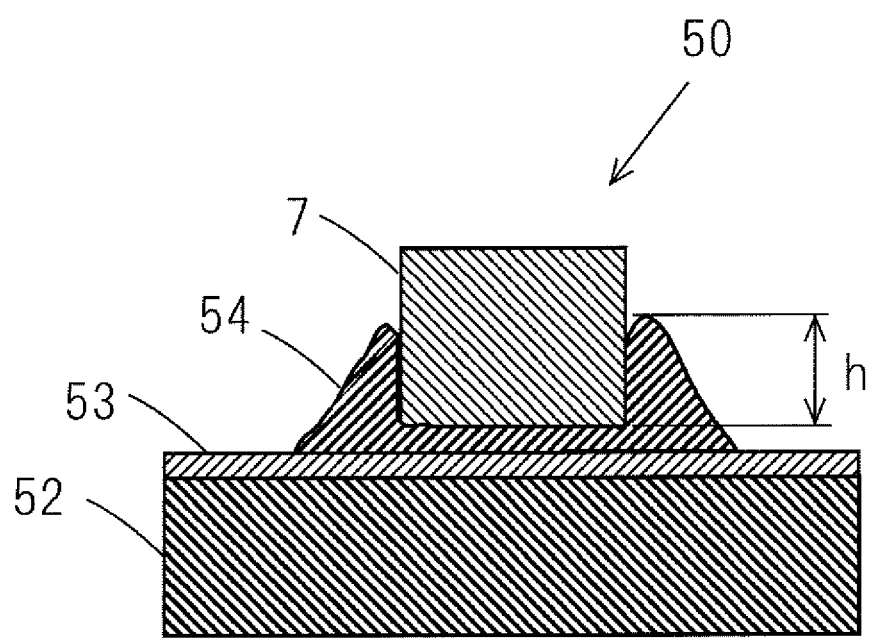
FIG. 32 is a cross sectional view diagrammatically illustrating height h of scrambling-up of a solder layer.

First, height h of scrambling-up of the solder layer 54 in each of the submounts of Example 9 and Comparative when soldered with a semiconductor device 7 was measured. FIG. 32 is a cross sectional view diagrammatically illustrating height h of scrambling-up of the solder layer 54. As shown, the scrambling-up height is the height to the highest point of a solder layer from an electrode layer below it in a semiconductor device 7. The scrambling-up height of a solder layer was measured by using an optical microscope or a scanning electron microscope upon heating the solder layer and bonding a semiconductor device thereto at each soldering temperature.

Table 7 shows results of the measurement of a solder scrambling-up height in each of Example 9 and Comparative Examples 7 and 8.

TABLE 7

| | Solder Layer Composition | | | | | | | |
|---|---|---|---|---|---|---|---|---|
| | Front Side Composition | Substrate Side Composition | Solder Film Thick. | Solder Scrambling-up Height (max., μm) Bonding Temperature | | | | |
| | (in atomic %) | (in atomic %) | (μm) | 220° C. | 245° C. | 270° C. | 295° C. | 315° C. |
| Ex. 9 | Ag:Sn = 6:94 | Ag:Sn = 14:86 | 10 | 0 | 0.9 | 1.5 | 4.8 | 8.7 |
| C. Ex. 7 | Ag:Sn = 6:94 | Ag:Sn = 6:94 | 10 | 0 | 8.2 | 9.1 | 9.1 | 9.4 |
| C. Ex. 8 | Ag:Sn = 14:86 | Ag:Sn = 14:86 | 10 | 0 | 0 | 0 | 0.5 | 8.2 |

As is apparent from Table 7, it was found that when the bonding temperature was varied from 220 to 325° C. in Example 9, the bonding failed at 270° C. The solder scrambling-up height h had values of 0.9 μm, 1.5 μm, 4.8 μm and 8.7 μm when at 245, 270, 295 and 315° C., respectively.

On the other hand, it was found that in Comparative Example 7 the bonding succeeded from at 245° C. and the solder scrambling-up height had values of 8.2 μm, 9.1 μm, 9.1 μm and 9.4 μm when at 245, 270, 295 and 310° C., respectively. In Comparative Example 7 where the solder layer 54 is uniform in composition, the solder scrambling-up height h was higher at any of temperatures of 245 to 315° C. than those in Example 9.

Also, in Comparative Example 8 with the solder layer having a higher melting point because of its Ag rich composition, it was found that the bonding failed unless the bonding temperature was raised to 290° C. or higher and the solder scrambling-up height h had values of 0.5 μm and 8.2 μm when at 295 and 315° C., respectively.

The soldering properties of the submounts in Example 9 and Comparative Examples 7 and 8 with a semiconductor device will be mentioned.

To investigate its solder bonding strength, a solder layer 54 of a submount 50 was molten by a heater and then a semiconductor device 7 was soldered from above with the solder layer and the junction was then cooled to make a sample. A tape peeling test by an evaluating tape was conducted and a peeling state of the junction was observed. The tape peeling test followed a conventional technique of measuring the adhesion strength of a metal, using a tape of identical adhesive strength. Of electrodes of semiconductor devices 7, those peeled off by the tape peeling test were regarded as a bonding failure. And, a proportion in number of such failures was taken to indicate a state of junction. The semiconductor devices 7 used was the light emitting diodes with electrodes of 300 μm square. Samples mounted for each of Example 9 and Comparative Examples 7 and 8 were 100 pieces in number.

As shown in Table 8, in Example 9, tape peeled-off percentages were 97% and 19% when bonding temperatures are 220° C. and 245° C., respectively. At any temperature from 270° C. to 315° C., the peeling-off was not observed.

In Comparative Example 7, the tape peeled-off percentage of 97% was observed at a bonding temperature of 220° C. but the peeling-off was not observed at any temperature from 245° C. to 315° C. On the contrary, in Comparative Example 8, it was found that at bonding temperatures of 225° C. and 245° C., a tape peeled-off percentage of 100% was observed, indicating that the bonding failed. And, at 270° C. and 295° C. 95% and 35% were observed, and at 315° C. was 0%, indicated that the bonding succeeded with no peeled-off sate.

TABLE 8

| | Solder Layer Composition | | | | | | | |
|---|---|---|---|---|---|---|---|---|
| | Front Side Composition | Substrate Side Composition | Solder Film Thick. | Tape Peeled-Off Percentage (%) Bonding Temperature | | | | |
| | (in atomic %) | (in atomic %) | (μm) | 220° C. | 245° C. | 270° C. | 295° C. | 315° C. |
| Ex. 9 | Ag:Sn = 6:94 | Ag:Sn = 14:86 | 10 | 97 | 19 | 0 | 0 | 0 |
| C. Ex. 7 | Ag:Sn = 6:94 | Ag:Sn = 6:94 | 10 | 97 | 0 | 0 | 0 | 0 |
| C. Ex. 8 | Ag:Sn = 14:86 | Ag:Sn = 14:86 | 10 | 100 | 100 | 95 | 35 | 0 |

Example 9 and Comparative Examples 7 and 8 indicate that a submount in which the solder layer 54 has its composition varied in its depth direction and has a composition distribution uneven over its depth succeeds in soldering when the solder layer is bonded at a temperature in a temperature range of 45° C. between 270 and 315° C. as shown in Example 9. While in Comparative Example 7, a submount succeeds in soldering when the solder layer is bonded at a temperature in a temperature range of 70° C. between 245 and 315° C., in Comparative Example 8 a submount can only succeed in soldering if the solder layer is bonded at 315° C. Also, in Example 9, their solder scrambling-up heights were much lower than those in Comparative Examples 7 and 8 when submounts were soldered at any bonding temperatures which allow to have no peeling-off. Especially, at a soldering temperature of 270° C., the solder scrambling-up height h of 1.5 μm in Example 9 is noted compared with that of about 9 μm in Comparative Example 8.

It is thus seen that the range of temperatures that can be used to successfully bond a semiconductor device 7 and the solder layer 54 together can be expanded as shown in Example 9 and that using a low temperature in such an expanded range as in Example 9 allows the solder scrambling-up height can be lowered than that in Comparative Example 7.

It should be understood that the present invention is not limited in its application to the use with a light emitting diode as mentioned in specific examples and a GaAs—GaAlAs DH, a chip and a packaged structure but is applicable to the use with a semiconductor device having a backside electrode or that requires a submount, and allows various modifications within the scope of the invention set forth in the appended claims which suffice it to say are as encompassed by the present invention. For example, the combination of alloy materials and its composition are not limited to Au—Sn and the examples of an alloy having its composition distribution made uneven are not limited, either. The semiconductor device is not limited to a light emitting diode using a stem, alone but may obviously be any semiconductor device using any type of lead frames or surface mounting package, too.

What is claimed is:
1. A submount comprising:
a submount substrate,
a substrate protective layer formed on the submount substrate,
an electrode layer formed on the substrate protective layer,
an adherent layer formed on the electrode layer, and a solder layer formed on the adherent layer
wherein said submount substrate is made of a nitride ceramic essentially consisting of aluminum nitride, and carbon concentration in at least one of the region adjacent to an interface formed between said submount substrate and said substrate protective layer, the region adjacent to an interface formed between said substrate protective layer and said electrode layer, the region adjacent to an interface formed between said electrode layer and said adherent layer, and the region adjacent to an interface formed between said adherent layer and said solder layer is not more than $1 \times 10^{20}$ atoms/cm$^3$;
the submount further comprising: said solder layer has a solder protective layer on said solder laver, wherein formed thereon and that carbon concentration in the region adjacent to an interface formed between said solder layer and said solder protective layer is not more than $1 \times 10^{20}$ atoms/cm$^3$.

* * * * *